(12) United States Patent
Nakase

(10) Patent No.: US 6,771,109 B2
(45) Date of Patent: Aug. 3, 2004

(54) SEMICONDUCTOR DEVICE WITH INTERFACE CIRCUITRY HAVING OPERATING SPEED DURING LOW VOLTAGE MODE IMPROVED

(75) Inventor: Yasunobu Nakase, Hyogo (JP)

(73) Assignee: Renesas Technology Corp., Osaka (JP)

( * ) Notice: Subject to any disclaimer, the term of this patent is extended or adjusted under 35 U.S.C. 154(b) by 0 days.

(21) Appl. No.: 10/315,940

(22) Filed: Dec. 11, 2002

(65) Prior Publication Data

US 2003/0227314 A1 Dec. 11, 2003

(30) Foreign Application Priority Data

Jun. 6, 2002 (JP) .......................................... 2002-165702

(51) Int. Cl.[7] ................................................. H03L 5/00
(52) U.S. Cl. ......................... 327/333; 327/108; 327/112; 326/81; 326/83
(58) Field of Search .............................. 327/333, 108, 327/112, 382, 427, 581; 326/80, 81, 83, 68

(56) References Cited

U.S. PATENT DOCUMENTS

| | | | |
|---|---|---|---|
| 6,028,450 A | * | 2/2000 | Nance ........................... 326/81 |
| 6,094,067 A | * | 7/2000 | Taniguchi ...................... 326/81 |
| 6,194,948 B1 | * | 2/2001 | Scian et al. .................... 327/382 |
| 2003/0080780 A1 | * | 5/2003 | Okamoto et al. ............. 326/83 |

FOREIGN PATENT DOCUMENTS

| JP | 59-151531 | 8/1984 |
|---|---|---|
| JP | 08-251012 | 9/1996 |

* cited by examiner

Primary Examiner—Long Nguyen
(74) Attorney, Agent, or Firm—McDermott Will & Emery LLP

(57) ABSTRACT

Core circuitry is configured with a transistor formed of a gate oxide film of a thin film thickness, receiving a first power supply voltage to operate. Interface circuitry is configured with a transistor formed of a gate oxide film of a thick film thickness, receiving a second power supply voltage to operate. An appropriate voltage is supplied to the substrate of a P channel MOS transistor and an N channel MOS transistor which are output drivers, based on a mode select signal set according to the voltage level of the second power supply voltage, whereby a PNP parasitic bipolar transistor and an NPN parasitic bipolar transistor are driven at high speed. Although the interface circuitry of a semiconductor device is configured with a transistor formed of a thick gate oxide film, the speed will not be degraded even if the power supply voltage is set at a low voltage level.

19 Claims, 11 Drawing Sheets

51, 52, 53, 54

55

56

SEMICONDUCTOR DEVICE WITH INTERFACE CIRCUITRY HAVING OPERATING SPEED DURING LOW VOLTAGE MODE IMPROVED

BACKGROUND OF THE INVENTION

1. Field of the Invention

The present invention relates to semiconductor devices. Particularly, the present invention relates to a semiconductor device with interface circuitry whose operating speed is not degraded even when the power supply voltage is of a low level.

2. Description of the Background Art

In accordance with microminiaturization in the semiconductor processing technique, the number of transistors that can be integrated in one chip has drastically increased these few years. At the same time, this implies more stringent requirements with respect to the voltage that can be applied to the transistor. It is inevitable to reduce the power supply voltage in order to suppress power consumption increase reflecting the larger number of integrated transistors. In the case of the most commonly employed MOS transistors, the power supply voltage has become as low as 2.5V, 1.8V and 1.5V as the smallest processing dimension is reduced to 0.25 $\mu$m, 0.18 $\mu$m and 0.15 $\mu$m. The power supply voltages are called the power supply voltage VDD of core circuitry, reflecting their usages at the core portion of the integrated circuitry.

In contrast, the power supply voltage VDDH of interface circuitry serving to transfer a signal with another chip is set to a higher potential level than the power voltage VDD of the core circuitry, irrespective of the progress in the processing technology. In the present state of affairs, power supply voltage VDDH is generally 3.0V to 3.3V. Since the state-of-the-art transistor cannot be used under 3.3V, the transistor of the interface circuitry has the gate oxide film intentionally formed thicker than that of the transistor of the core circuitry, despite the great degradation in performance.

The reason why power supply voltage VDDH of the interface circuitry is set high is set forth below. Firstly, not all the semiconductor devices mounted on the board are fabricated by the most advanced processing technology. There are many semiconductor devices that operate according to the conventional interface standard. Modification of the interface standard will induce considerable turmoil.

The second reason may be due to the close provision of the interface circuitry with respect to the input/output pins. In view of the surge damage of the input/output pins caused by static electricity a thicker gate oxide film is favorable from the standpoint of a higher electrostatic damage resistance (ESD resistance).

In the following, a transistor with a thick gate oxide film is called a thick film transistor whereas a transistor with a thin gate oxide film is called a thin film transistor.

FIG. 14 is a circuit diagram to describe the portion related to data output of a conventional semiconductor device that receives two types of power supply voltages VDD and VDDH for operation.

Referring to FIG. 14, a conventional semiconductor device 500 includes core circuitry 501 receiving power supply voltage VDD to operate, and interface circuitry 502 receiving power supply voltage VDDH to operate.

Core circuitry 501 includes a NAND gate G51 receiving a signal D0 and an output enable signal EN, an inverter 510 receiving and inverting output enable signal EN, and a NOR gate G52 receiving the output of inverter 510 and signal D0. Each of these circuits included in core circuitry 501 is formed of thin film transistors.

Here, signal D0 is the output data received from an internal circuit not shown in core circuitry 501. When output enable signal EN has a logic level of H (logical high), signal D0 is output as a signal D1 from the output node of interface circuitry 502. When output enable signal EN has a logical level of L (logical low), the output node of interface circuitry 502 is set to a high impedance state.

Interface circuitry 502 includes level shift circuits 512 and 514, and an output drive circuit 516 driving an output node ND51 according to the signal output from level shift circuits 512 and 514.

Level shift circuits 512 and 514 receive the outputs of NAND gate G51 and NOR gate G52, respectively, provided from core circuitry 501 to change the potential amplitude of each received signal between core circuitry 501 receiving power supply voltage VDD to operate and output drive circuit 516 receiving power supply voltage VDDH to operate.

Output drive circuit 516 includes an inverter 522 receiving and inverting the signal output from level shift circuit 512, an inverter 524 receiving and inverting the output of inverter 522, and a P channel MOS transistor P51 connected to a power supply node to which power supply voltage VDDH is applied (referred to as power supply node VDDH hereinafter) and output node ND51 to receive the output of inverter 524 at its gate. Output drive circuit 516 also includes an inverter 526 receiving and inverting the signal output from level shift circuit 514, an inverter 528 receiving and inverting the output of inverter 526, and an N channel MOS transistor N51 connected to output node ND51 and a ground node to receive the output of inverter 528 at its gate. A capacitance CL1 is the load capacitance of output node ND51.

The operation of semiconductor device 500 will be described here.

When data of an H level is output from semiconductor device 500, output enable signal EN and signal D0 are both set to an H level. On the part of P channel MOS transistor P51, the output of NAND gate G51 is driven to an L level, and the output of inverter 524 is driven to an L level. Therefore, P channel MOS transistor P51 is turned ON.

On the part of N channel MOS transistor N51, the output of NOR gate G52 is driven to an L level, and the output of inverter 528 is driven to an L level. Therefore, N channel MOS transistor N51 is turned OFF. Accordingly, output node ND51 is driven to an H level (VDDH), whereby a signal D1 of an H level is output.

In contrast, when data of an L level is output from semiconductor device 500, output enable signal EN is set at an H level and signal D0 is set at an L level. On the part of P channel MOS transistor P51, the output of NAND gate G51 is driven to an H level, and the output of inverter 524 is driven to an H level. Therefore, P channel MOS transistor P51 is turned OFF.

On the part of N channel MOS transistor N51, the output of NOR gate G52 is driven to an H level, and the output of inverter 528 is driven to an H level. Therefore, N channel MOS transistor N51 is turned ON. Accordingly, output node ND51 is driven to an L level (GND), whereby signal D1 of an L level is output.

When semiconductor device 500 does not output data, output enable signal EN is set at an L level. On the part of P channel MOS transistor P51, the output of NAND gate G51 is driven to an H level, and the output of inverter 524 is driven to an H level. Therefore, P channel MOS transistor P51 is turned OFF.

On the part of N channel MOS transistor N51, the output of NOR gate G52 is driven to an L level, and the output of inverter 528 is driven to an L level. Therefore, N channel MOS transistor N51 is also turned OFF. Accordingly, both the two output transistors P51 and N51 are turned OFF, whereby output node ND51 attains a high impedance state.

Reducing power consumption has become a critical issue in accordance with the spread of portable terminals and the like. Power consumption is proportional to the square of the power supply voltage. Therefore, lowering the power supply voltage is extremely effective to reducing power consumption. Although the power supply voltage of the core circuitry has been reduced in accordance with microminiaturization of the semiconductor processing technology, the 3V type is still employed for the interface circuitry as described above, except for particular applications. However, the problem of the slow operating speed of the interface circuitry and power consumption were not so acute thus far.

Corresponding to the need with the increasing demand for interface of high speed these few years, the problem of power consumption has become noticeable. For example, in the case where a 32-bit bus of 30 pF in load capacitance is driven under the power supply voltage VDDH of 3V and 200 megabits/second/pin, the maximum power consumption becomes as high as approximately 860 mW. Since the tolerable power consumption of a chip is approximately 1W when a semiconductor device is sealed in a plastic package, only 140 mW will be allowed for the power consumption of the core circuitry. In practice, it is impossible to design core circuitry with the power consumption suppressed to 140 mW and below.

A possible consideration is to reduce the power supply voltage VDDH of the interface circuitry to lower the power consumption. However, this will disable high speed data communication since the driving capability of the thick film transistor employed in the interface circuitry will be rapidly reduced when the voltage is lowered. If a thin film transistor is employed for the output driver for the purpose of improving the operating speed when power supply voltage VDDH is set to a lower level, the aforementioned problem of reduction in ESD resistance is induced.

Furthermore, the 3V type device cannot be used if power supply voltage VDDH is reduced to a lower level. This means that the logic device that can be incorporated at the board will be restricted, resulting in the problem that the cost is eventually increased.

SUMMARY OF THE INVENTION

In view of the foregoing, an object of the present invention is to provide a semiconductor device with interface circuitry formed of a thick film transistor, and not degraded in speed even if the power supply voltage is reduced to a low level.

Another object of the present invention is to provide a semiconductor device with interface circuitry formed of a thick film transistor, and accommodating both a low power supply voltage mode and a higher power supply voltage mode.

According to an aspect of the present invention, a semiconductor device includes core circuitry configured with a MOS transistor formed of a gate oxide film having a first film thickness, and receiving a first power supply voltage to operate, and interface circuitry configured with a MOS transistor formed of a gate oxide film having a second film thickness thicker than the first film thickness, and receiving a second power supply voltage to operate. The core circuitry includes an internal circuit providing an internal signal to the interface circuitry. The interface circuit includes an output MOS transistor connected to an output node to drive the output node according to the internal signal, and an activation circuit activating a parasitic bipolar transistor formed in parasitism with the output MOS transistor according to an operation of the output MOS transistor when a low voltage operation mode is selected by a mode select signal.

In the semiconductor device of the present invention, even if the operating power supply voltage is reduced to a low level in the interface circuitry configured with a MOS transistor formed by a gate oxide film having a film thickness thicker than the gate oxide film of the MOS transistor forming the core circuitry, a parasitic bipolar transistor that operates at high speed operates together with the MOS transistor that drives the output node, whereby the driving capability of the output node is compensated for.

Therefore, the power supply voltage of interface circuitry can be lowered without degrading the operating speed. Power consumption of the semiconductor device can be reduced while maintaining the performance.

Preferably, the output MOS transistor includes a P channel MOS transistor driving the output node to a potential corresponding to a high level according to the internal signal, and an N channel MOS transistor driving the output node to a potential corresponding to a low level according to the internal signal. The parasitic bipolar transistor includes a PNP parasitic bipolar transistor formed in parasitism with the P channel MOS transistor, and an NPN parasitic bipolar transistor formed in parasitism with the N channel MOS transistor.

Preferably, the core circuitry further includes a charge and discharge drive circuit. The charge and discharge drive circuit drives the NPN parasitic bipolar transistor according to the internal signal when the low voltage operation mode is selected.

Preferably, the core circuitry further includes another activation circuit activating the parasitic bipolar transistor according to an operation of the output MOS transistor when the low voltage operation mode is selected. The another activation circuit includes a charge drive circuit. The activation circuit includes a discharge drive circuit. When the low voltage operation mode is selected, the charge drive circuit turns the PNP parasitic bipolar transistor OFF in response to the internal signal, the discharge drive circuit turns the PNP parasitic bipolar transistor ON in response to the internal signal.

Preferably, the activation circuit further includes another charge drive circuit. The another charge drive circuit turns the PNP parasitic bipolar transistor OFF irrespective of the voltage level of the internal signal when the low voltage operation mode is not selected.

Preferably, the discharge drive circuit includes another N channel MOS transistor, and another NPN parasitic bipolar transistor formed in parasitism with the another N channel MOS transistor according to an operation of the another N channel MOS transistor.

Preferably, the another activation circuit further includes a charge and discharge drive circuit. The charge and discharge drive circuit drives the another NPN parasitic bipolar transistor according to the internal signal when the low voltage operation mode is selected.

Preferably, the another activation signal includes a first base drive circuit driving the NPN parasitic bipolar transistor in response to the internal signal when the low voltage operation mode is selected, and a second base drive circuit driving the another NPN parasitic bipolar transistor in response to the internal signal when the low voltage operation mode is selected. The activation circuit further includes a third base drive circuit driving the NPN parasitic bipolar transistor in response to the internal signal when another low voltage operation mode for operating at a voltage level higher than the voltage level in the low voltage operation mode is selected by the mode select signal, and a fourth base drive circuit driving the another NPN parasitic bipolar transistor in response to the internal signal when the another low voltage operation mode is selected.

Preferably, the semiconductor device further includes a level conversion circuit converting a potential amplitude of a signal received from the internal circuit to a potential amplitude corresponding to the second power supply voltage, and a switch circuit receiving a signal from the internal circuit and a signal having the potential amplitude converted by the level conversion circuit. The switch circuit provides the signal received from the internal circuit to the interface circuitry when the low voltage operation mode is selected, and provides the signal having the potential amplitude converted by the level conversion circuit to the interface circuitry when the low voltage operation mode is not selected.

Preferably, the internal circuit includes a mode select circuit generating and providing to the interface circuitry the mode select signal. The mode select circuit receives the second power supply voltage to compare the second power supply voltage with a reference voltage, and outputs the mode select signal when the second power supply voltage is lower than the reference voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
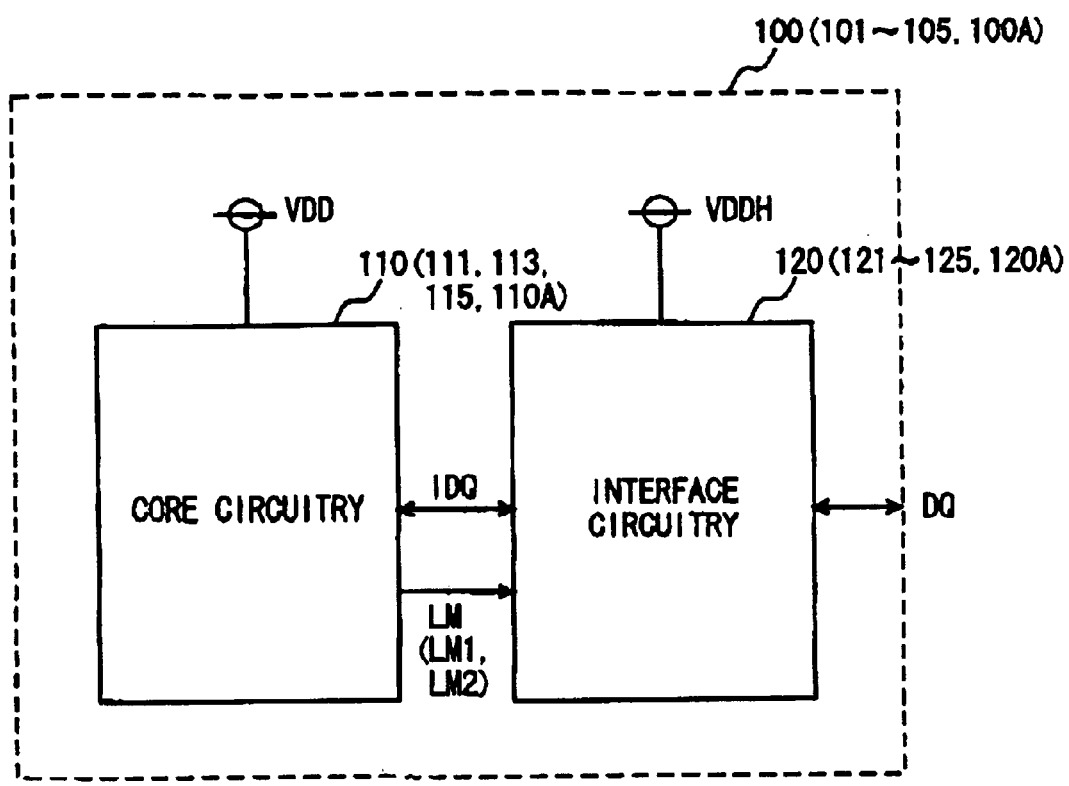
FIG. 1 is a block diagram of the entire structure of a semiconductor device according to a first embodiment of the present invention.

Embodiments of the present invention will be described in detail with reference to the drawings. In the drawings, the same or corresponding components have the same reference characters allotted, and description thereof will not be repeated.

First Embodiment

Referring to FIG. 1, a semiconductor device 100 according to a first embodiment of the present invention includes interface circuitry 120 transferring a signal DQ with another device via a data bus or the like, and core circuitry 110 transferring an internal signal IDQ with interface circuitry 120.

Interface circuitry 120 receives power supply voltage VDDH for operation. Core circuitry 110 receives power supply voltage VDD for operation. Power supply voltages VDDH and VDD can be supplied directly from an external source. Alternatively, a power supply circuit that receives an externally applied power supply voltage VDDH to generate an internal power supply voltage VDD can be incorporated, from which the power supply voltage is provided.

Figure 2:
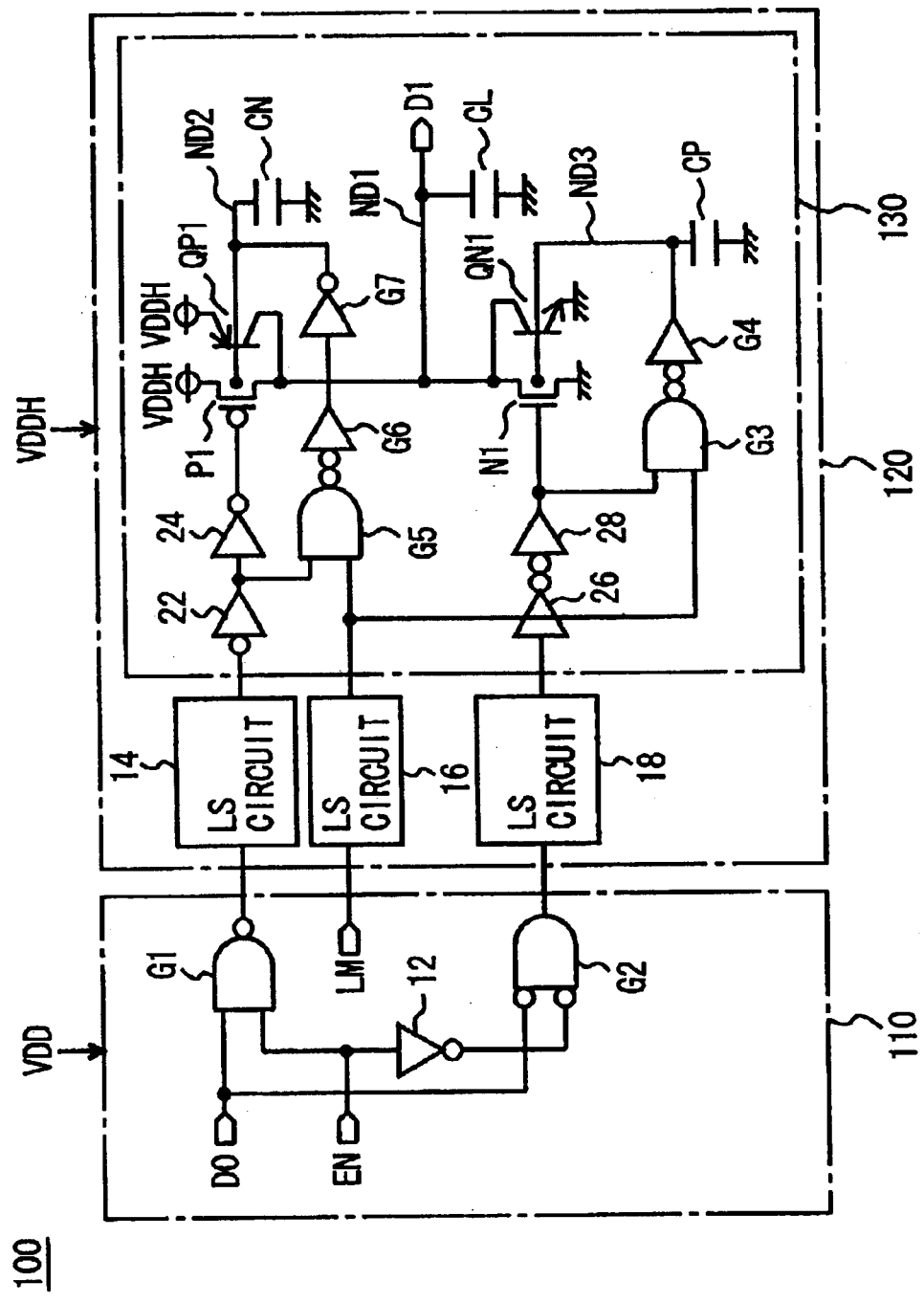
FIGS. 2, 3, 4, 5, 6 and 7 are circuit diagrams to describe the portion related to data output of a semiconductor device according to the first embodiment, second embodiment, third embodiment, fourth embodiment, fifth embodiment and sixth embodiment, respectively.

Referring to FIG. 2 corresponding to the portion related to data output of semiconductor device 100 of the first embodiment, core circuitry 110 includes a NAND gate G1 receiving a signal D0 and an output enable signal EN, an inverter 12 receiving and inverting output enable signal EN, and a NOR gate G2 receiving an output of inverter 12 and signal D0. Each circuit included in core circuitry 110 is formed of a thin film transistor.

Signal D0 is the output data received from an internal circuit not shown in core circuitry 110. When output enable signal EN is at an H level, signal D0 is output as a signal D1 from the output node of interface circuitry 120. When output enable signal EN is at an L level, the output node of interface circuitry 120 attains a high impedance state.

A mode select signal LM output towards interface circuitry 120 is set by the aforementioned internal circuit. The internal circuit sets mode select signal LM to an L level when power supply voltage VDDH received by interface circuitry 120 is of the conventional voltage level (3V type), and sets mode select signal LM to an H level (VDD) when power supply voltage VDDH received by interface circuitry 120 is of aglow voltage level (1V).

Interface circuitry 120 includes level shift circuits 14, 16 and 18, and an output drive circuit 130 that drives an output node ND1 according to the signal output from level shift circuits 14, 16 and 18.

Level shift circuits 14, 16 and 18 receive the output of NAND gate G1, mode select signal LM, and the output of NOR gate G2, respectively, to convert the potential amplitude of each received signal between core circuitry 110 operating under power supply voltage VDD and output drive circuit 130 operating under power supply voltage VDDH.

Output drive circuit 130 includes an inverter 22 receiving and inverting the signal output from level shift circuit 14, an inverter 24 receiving and inverting the output of inverter 22, and a P channel MOS transistor P1 connected to power supply node VDDH and output node ND1 to receive the output of inverter 24 at its gate. Output drive circuit 130 includes an inverter 26 receiving and inverting the signal output from level shift circuit 18, an inverter 28 receiving and inverting the output of inverter 26, and an N channel MOS transistor N1 connected to an output node ND1 and the ground node to receive the output of inverter 28 at its gate.

Output drive circuit 130 further includes a NAND gate G5 receiving the output of inverter 22 and the output of level shift circuit 16, an inverter G6 receiving and inverting the output of NAND gate G5, an inverter G7 receiving and inverting the output of inverter G6 to provide the inverted output to a node ND2, and a PNP parasitic bipolar transistor QP1 of a P channel MOS transistor P1 generated by connecting node ND2 to the substrate of P channel MOS transistor P1.

Output drive circuit 130 further includes a NAND gate G3 receiving the output of inverter 28 and the output of the level shift circuit 16, an inverter G4 receiving and inverting the output of NAND gate G3 to provide the inverted output to a node ND3, and an NPN parasitic bipolar transistor QN1 of N channel MOS transistor N1 generated by connecting node ND3 to the substrate of N channel MOS transistor N1.

Each of the circuits included in interface circuitry 120 as well as P channel MOS transistor P1 and N channel MOS transistor N1 is formed of a thick film transistor.

Capacitances CL, CN and CP are the load capacitance of output node ND1, node ND2 and node ND3, respectively.

Figure 14:
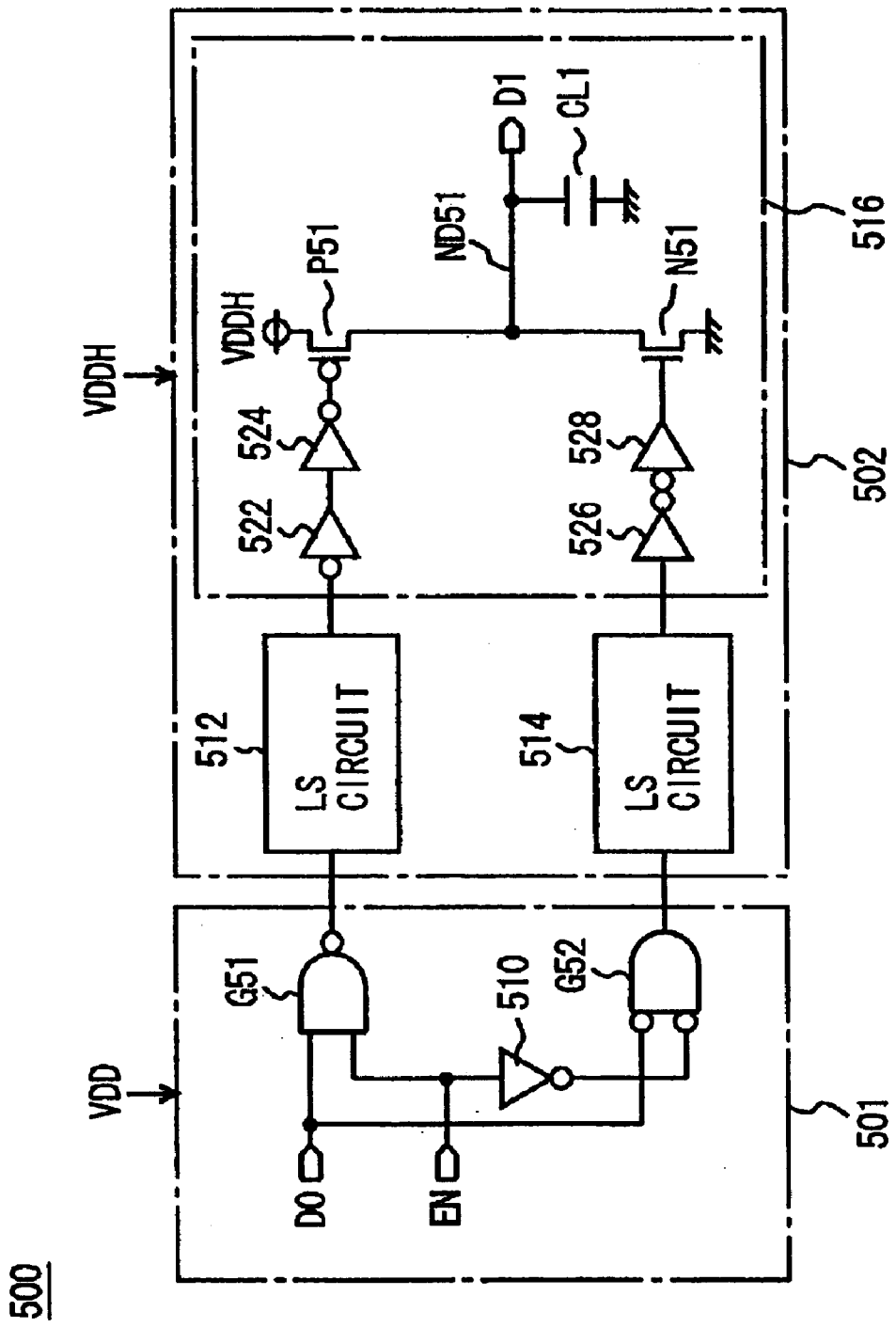
FIG. 14 is a circuit diagram to describe the portion related to data output of a conventional semiconductor device.

The difference between the structure of semiconductor device 100 of the first embodiment shown in FIG. 2 and conventional semiconductor device 500 shown in FIG. 14 is set forth below.

In semiconductor device 100, mode select signal LM is newly provided. Mode select signal LM is set to an H level and an L level when the power supply voltage VDDH of interface circuitry. 120 is of the low voltage (1V) and the conventional voltage (3V type), respectively.

Since mode select signal LM is generated by an internal circuit not shown in core circuitry 110, level shift circuit 16 is provided to convert the potential amplitude of mode select signal LM to the potential amplitude of interface circuitry 120. NAND gate G5 inverts the output of inverter 22 when mode select signal LM is at an H level. The output of NAND gate G5 is then provided to node ND2 via the two stages of inverters G6 and G7. Node ND2 is connected to the substrate of P channel MOS transistor P1. NAND gate G3 inverts the output of inverter 28 when mode select signal LM is at an H level. The output of NAND gate G3 is provided to node ND3 via inverter G4. Node ND3 is connected to the substrate of N channel MOS transistor N1.

The operation of semiconductor device 100 will be described here.

(1) When Power Supply Voltage VDDH is of Conventional Level (3V Type):

The internal circuit not shown in core circuitry 110 sets mode select signal LM to an L level. When semiconductor device 100 outputs data of an H level, the internal circuit sets both output enable signal EN and signal D0 to an H level. On the part of P channel MOS transistor P1, the output of NAND gate G1 is driven to an L level and the output of inverter 24 is driven to an L level. Therefore, P channel MOS transistor P1 is turned ON.

On this occasion, mode select signal LM is at an L level. Therefore, level shift circuit 16 provides an output of an L level, and NAND gate G5 provides an output of an H level, independent of the status of signal D0 and output enable signal EN. Accordingly, node ND2 is driven to an H level (VDDH) by inverter G7. When mode select signal LM is at an L level, PNP parasitic bipolar transistor QP1 is not turned ON, and P channel MOS transistor P1 operates as a normal P channel MOS transistor.

On the part of N channel MOS transistor N1, the output of NOR gate G2 is driven to an L level, and the output of inverter 28 is driven to an L level. Therefore, N channel MOS transistor N1 is turned OFF.

Likewise NAND gate G5, NAND gate G3 provides an output of an H level, independent of the status of signal D0 and output enable signal EN since mode select signal LM is at an L level. Therefore, node ND3 is driven to an L level (GND) by inverter G4. When mode select signal LM is at an L level, NPN parasitic bipolar transistor QN1 is not turned ON.

Thus, output node ND1 is driven to an H level (VDDH) by P channel MOS transistor P1. Signal D1 of an H level is output.

When data of an L level is output by semiconductor device 100, the internal circuit sets output enable signal EN to an H level and signal D0 to an L level. On the part of P channel MOS transistor P1, the output of NAND gate G1 is driven to an H level, and the output of inverter 24 is driven to an H level. Therefore, P channel MOS transistor P1 is turned OFF. On this occasion, PNP parasitic bipolar transistor QP1 is not turned ON since mode select signal LM is at an L level.

On the part of N channel MOS transistor N1, the output of NOR gate G2 is driven to an H level, and the output of inverter 28 is driven to an H level. Therefore, N channel MOS transistor N1 is turned ON. Since mode select signal LM is at an L level here, NPN parasitic bipolar transistor QN1 is not turned on, and N channel MOS transistor N1 operates as a normal N channel MOS transistor.

Thus, output node ND1 is driven to an L level (GND) by N channel MOS transistor N1. Signal D1 of an L level is output.

When data is not output from semiconductor device 100, the internal circuit sets output enable signal EN to an L level. On the part of P channel MOS transistor P1, the output of NAND gate G1 is driven to an H level, and the output of inverter 24 is driven to an H level. Therefore P channel MOS transistor P1 is turned OFF.

On the part of N channel MOS transistor N1, the output of NOR gate G2 is driven to an L level, and the output of inverter 28 is driven to an L level. Therefore, N channel MOS transistor N1 is turned OFF. Since mode select signal LM is at an L level, PNP parasitic bipolar transistor QP1 and NPN parasitic bipolar transistor QN1 are both not turned ON.

Therefore, since both the two output transistors P1 and N1 are turned OFF, and neither PNP parasitic bipolar transistor QP1 nor NPN parasitic bipolar transistor QN1 is turned ON, output node ND1 attains a high impedance state.

When power supply voltage VDDH is at the normal voltage level (3V type), output drive circuit 130 operates as in a conventional manner.

(2) When Power Supply Voltage VDDH is of a Low Level (1V):

In this case, the internal circuit not shown in core circuitry 110 sets mode select signal LM to an H level. When semiconductor device 100 outputs data of an H level, the internal circuit sets both output enable signal EN and signal D0 to an H level. On the part of P channel MOS transistor P1, the output of NAND gate G1 is driven to an L level, and the output of inverter 24 is driven to an L level. Therefore, P channel MOS transistor P1 is turned ON.

The driving capability of P channel MOS transistor P1 is low since power supply voltage VDDH is of the low level of 1V. This means that a long period of time is required to charge output node ND1 that has load capacitance CL by using just P channel MOS transistor P1. The operating speed of output drive circuit 130 will be degraded significantly.

It is to be noted that the output of level shift circuit 16 is at an H level since mode select signal LM is at an H level, and NAND gate G5 provides an output of an L level since the output of inverter 22 is also at an H level. Therefore, node ND2 is driven to an L level (GND) by inverter G7. PNP parasitic bipolar transistor QP1 is turned ON.

For a MOS transistor, the driving current is merely proportional to the square of the potential between the gate and source. For a bipolar transistor, the driving current is proportional to the potential between the base and emitter in an exponential manner. In PNP parasitic bipolar transistor QP1, sufficient driving current can be obtained with a potential of approximately 0.8V between the base and emitter. Therefore, output node ND1 is charged at high speed as a result of PNP parasitic bipolar transistor QP1 being turned ON.

On the part of N channel MOS transistor N1, the output of NOR gate G2 is driven to an L level, and the output of inverter 28 is driven to an L level. Therefore, N channel MOS transistor N1 is turned OFF. On this occasion, the output of NAND gate G3 is at an H level since inverter 28 provides an output of an L level. Node ND3 is driven to an L level (GND) by inverter G4. NPN parasitic bipolar transistor QN1 is not turned on.

Accordingly, output node ND1 is driven at high speed to an H level (VDDH) by PNP parasitic bipolar transistor QP1 of P channel MOS transistor P1. Signal D1 of an H level is output.

When data of an L level is output by semiconductor device 100, the internal circuit sets output enable signal EN to an H level and signal D0 to an L level. On the part of P channel MOS transistor P1, the output of NAND gate G1 is driven to an H level, and the output of inverter 24 is driven to an H level. Therefore, P channel MOS transistor P1 is turned OFF. Since the output of inverter 22 is at an L level, NAND gate G5 provides an output of an H level. Node ND2 is driven to an H level (VDDH) by inverter G7. PNP parasitic bipolar transistor QP1 is not turned ON.

On the part of N channel MOS transistor N1, the output of NOR gate G2 is driven to an H level, and the output of inverter 28 is driven to an H level. N channel MOS transistor N1 is turned ON. Since power supply voltage VDDH is of a low level of 1V, the driving capability of N channel MOS transistor N1 is low. Therefore, a long period of time is required to charge output node ND1 that has load capacitance CL by just N channel MOS transistor N1. The operating speed of output drive circuit 130 will be degraded significantly.

However, level shift circuit 16 provides an output of an H level since mode select signal LM is at an H level. Inverter 28 also provides an output of an H level. Therefore, the output of NAND gate G3 is driven to an L level. Accordingly, node ND3 is driven to an H level (VDDH) by inverter G4. NPN parasitic bipolar transistor QN1 is turned ON. Since the driving current of a bipolar transistor is large as mentioned above, sufficient driving current can be obtained at NPN parasitic bipolar transistor QN1 with a potential of approximately 0.8V between the base and emitter. Thus, output node ND1 is discharged at high speed in response to NPN parasitic bipolar transistor QN1 being turned ON.

Thus, output node ND1 is driven at high speed to an L level (GND) by NPN parasitic bipolar transistor QN1 of N channel MOS transistor N1. Signal D1 of an L level is output.

When data is not output from semiconductor device 100, the internal circuit sets output enable signal EN to an L level. On the part of P channel MOS transistor P1, the output of NAND gate G1 is driven to an H level, and the output of inverter 24 is driven to an H level. Therefore, P channel MOS transistor P1 is turned OFF. Since the output of inverter 22 is at an L level, NAND gate G5 provides an output of an H level. Node ND2 is driven to an H level by inverter G7. PNP parasitic bipolar transistor QP1 is not turned ON.

On the part of N channel MOS transistor N1, NOR gate G2 provides an output of an L level, and inverter 28 provides an output of an L level. Therefore, N channel MOS transistor N1 also turned OFF. Since inverter 28 provides an output of an L level, the output of NAND gate G3 is driven to an H level. Node ND3 is driven to an L level by inverter G4. NPN parasitic bipolar transistor QN1 is not turned ON.

Since the two output transistors P1 and N1 are both OFF, and PNP and NPN parasitic bipolar transistors QP1 and QN1 are neither turned ON, output node ND1 attains a high impedance state.

Thus, when power supply voltage VDDH is of a low level (1V), PNP parasitic bipolar transistor QP1 and NPN parasitic bipolar transistor QN1 charge and discharge output node ND1 at high speed. Therefore, output drive circuit 130 operates at high speed even if power supply voltage VDDH of interface circuitry 120 is of a low level.

The above description is based on the case where the power supply voltage VDDH is set to 1V in a low voltage operation mode. However, power supply voltage VDDH in a low voltage operation mode is not limited to 1V, and may take any level in the range from the lowest voltage (approximately 0.8V) where PNP parasitic bipolar transistor QP1 and NPN parasitic bipolar transistor QN1 are turned ON to the conventional voltage level (3V type).

According to semiconductor device 100 of the first embodiment, the parasitic bipolar transistor of the output transistor is driven according to the output data when power supply voltage VDDH of interface circuitry 120 is of a low level. Therefore, the driving capability of output node ND1 is compensated for by the parasitic bipolar transistor. Interface circuitry 120 can operate without degradation in speed even in the case where power supply voltage VDDH is of a low level.

Semiconductor device 100 of the first embodiment accommodates both cases where the voltage of the interface circuitry is of the conventional level (3V type) and of a low level. Therefore, restriction in the voltage of the logic device that can be incorporated on the board is eliminated. Thus, the cost can be reduced.

According to semiconductor device 100 of the first embodiment, power supply voltage VDDH of interface circuitry 120 is reduced to a low level. Therefore, power consumption of interface circuitry 120 is reduced to ⅑ when 1V is taken a power supply voltage VDDH, as compared to the case where the conventional voltage is 3V.

Second Embodiment

Since the base nodes of PNP parasitic bipolar transistor QP1 and NPN parasitic bipolar transistor QN1 in the previous first embodiment are the substrates of P channel MOS transistor P1 and N channel MOS transistor N1, respectively, the parasitic capacitance is extremely large. In the first embodiment, the base nodes of PNP parasitic bipolar transistor QP1 and NPN parasitic bipolar transistor QN1 are driven by inverters G7 and G4, respectively, configured with thick film transistors. Since a thick film transistor has the driving capability reduced rapidly when the power supply voltage becomes lower, an extremely large MOS transistor is required to drive PNP parasitic bipolar transistor QP1 and NPN parasitic bipolar transistor QN1 at high speed.

In the present second embodiment, the drive of the base nodes of PNP parasitic bipolar transistor QP1 and NPN parasitic bipolar transistor QN1 is partially conducted by means of a thin film transistor to reduce the circuit area, as compared to that of the first embodiment.

Figure 3:
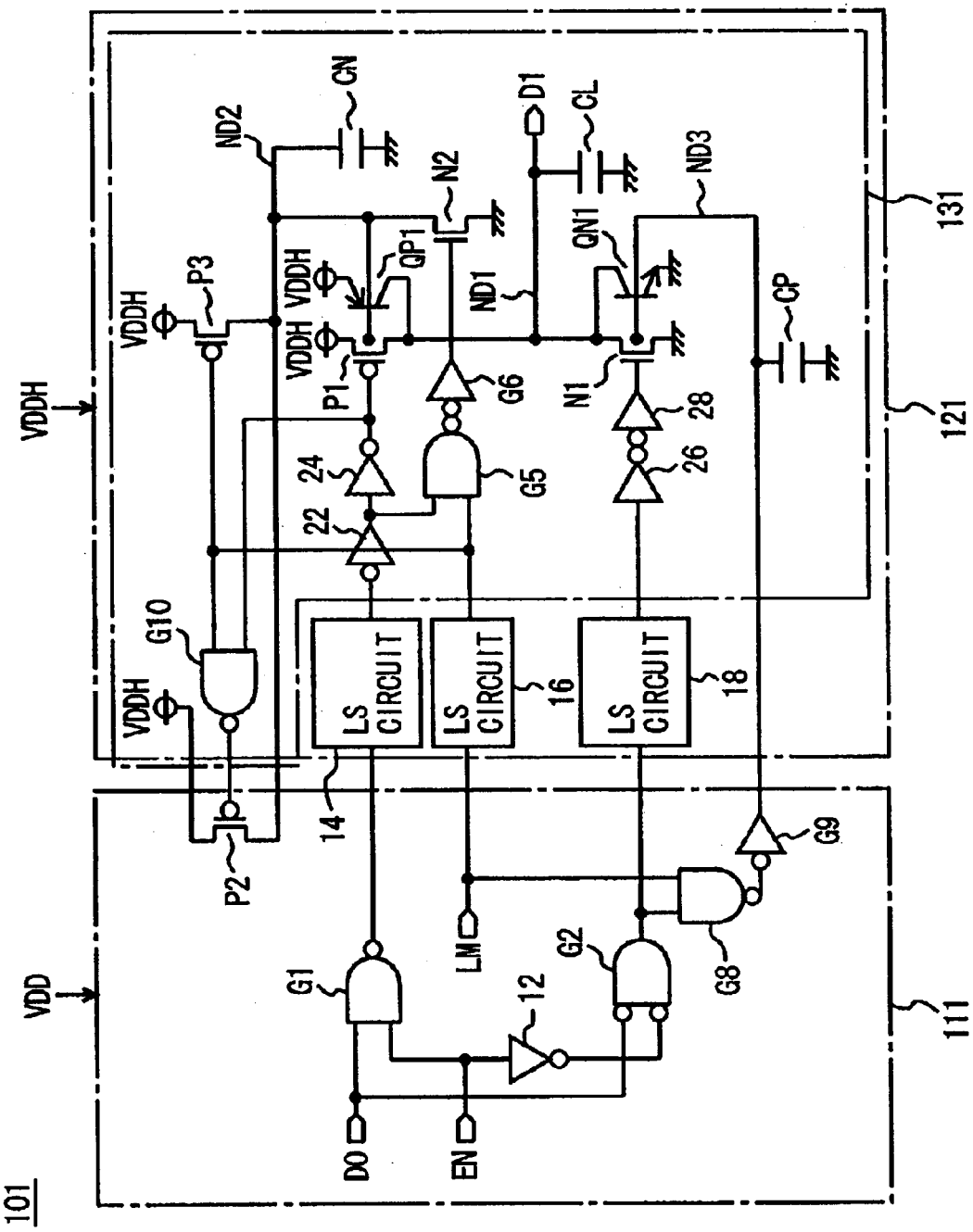

Referring to FIG. 3, a semiconductor device 101 according to the second embodiment includes core circuitry 111, and interface circuitry 121.

Core circuitry 111 includes, in addition to the structure of core circuitry 110 shown in FIG. 1, a P channel MOS transistor P2 connected to a power supply node VDDH of interface circuitry 121 and node ND2 to receive at its gate the output of NAND gate G10 in output drive circuit 131 that will be described afterwards, a NAND gate G8 receiving mode select signal LM and the output of NOR gate G2, and an inverter G9 receiving and inverting the output of NAND gate G8 to provide the inverted output to node ND3. P channel MOS transistor P2, NAND gate G8 and inverter G9 are all formed of thin film transistors.

The remaining circuit configuration of core circuitry 111 is similar to that of core circuitry 110 shown in FIG. 2. Therefore, description thereof will not be repeated.

Interface circuitry 121 includes an output drive circuit 131 instead of output drive circuit 130 according to the structure of interface circuitry 120 shown in FIG. 2.

Output drive circuit 131 is based on the structure of output drive circuit 130, provided that NAND gate G3 and inverter G4 and G7 are absent, and further includes a NAND gate G10 receiving the outputs of level shift circuit 16 and inverter 24, and having its output node connected to the gate of P channel MOS transistor P2, a P channel MOS transistor P3 connected to power supply node VDDH and node ND2 to receive the output of level shift circuit 16 at its gate, and an N channel MOS transistor N2 connected to node ND2 and the ground node to receive the output of inverter G6 at its gate.

The difference between output drive circuit 131 of the present embodiment and output drive circuit 130 shown in FIG. 2 is set forth below. In contrast to output drive circuit 130 having node ND3 driven by inverter G4 formed of a thick film transistor, output drive circuit 131 has node ND3 driven by inverter G9 of core circuitry 111 formed of a thin film transistor. Furthermore, in output drive circuit 130, node ND2 is driven by inverter G7 formed of a thick film transistor. In output drive circuit 131, node ND2 is driven to an H level (VDDH) by P channel MOS transistor P2 in core circuitry 111 or P channel MOS transistor P3, and driven to an L level (GND) by N channel MOS transistor N2.

The remaining circuit structure of interface circuitry 121 is similar to that of interface circuitry 120 of FIG. 2. Therefore, description thereof will not be repeated.

The operation of semiconductor device 101 will be described here.

(1) When Power Supply Voltage VDDH is of Conventional Voltage Level (3V type):

Consider the case where semiconductor device 101 outputs data of an H level. On the part of P channel MOS transistor P1, the output of NAND gate G1 is driven to an L level and the output of inverter 24 is driven to an L level. Therefore, P channel MOS transistor P1 is turned ON.

Since mode select signal LM is at an L level, level shift circuit 16 provides an output of an L level. NAND gate G5 provides an output of an H level independent of the status of signal D0 and output enable signal EN. Therefore, N channel MOS transistor N2 is turned OFF. An L level output from level shift circuit 16 causes P channel MOS transistor P3 to be turned ON whereas an H level output from NAND gate G10 causes P channel MOS transistor P2 to be turned OFF. Therefore, node ND2 is driven to an H level (VDDH) by P channel MOS transistor P3. PNP parasitic bipolar transistor QP1 is not turned ON. P channel MOS transistor P1 operates as a normal P channel MOS transistor.

On the part of N channel MOS transistor N1, the output of NOR gate G2 is driven to an L level and the output of inverter 28 is driven to an L level. Therefore, N channel MOS transistor N1 is turned OFF. Since mode select signal LM is at an L level, NAND gate G8 provides an output of an H level. Thus, node ND3 is driven to an L level (GND) by inverter G9. NPN parasitic bipolar transistor QN1 is not turned ON.

Thus, output node ND1 is driven to an H level (VDDH) by P channel MOS transistor P1. Signal D1 of an H level is output.

Next, consider the case where semiconductor device 101 outputs data of an L level. On the part of P channel MOS transistor P1, the output of NAND gate G1 is driven to an H level, and the output of inverter 24 is driven to an H level. Therefore, P channel MOS transistor P1 is turned OFF.

Since mode select signal LM is at an L level, the status of N channel MOS transistor N2 and P channel MOS transistors P2 and P3 is identical to the case where data of an H level is output from semiconductor device 101. Therefore, node ND2 is driven to an H level (VDDH) by P channel MOS transistor P3. PNP parasitic bipolar transistor QP1 is not turned ON.

On the part of N channel MOS transistor N1, the output of NOR gate G2 is driven to an H level, and the output of inverter 28 is driven to an H level. Therefore, N channel MOS transistor N1 is turned ON. Since mode select signal LM is at an L level, NAND gate G8 provides an output of an H level. Therefore, node ND3 is driven to an L level (GND) by inverter G9. NPN parasitic bipolar transistor QN1 is not turned ON. N channel MOS transistor N1 operates as a normal N channel MOS transistor.

Thus, output node ND1 is driven to an L level (GND) by N channel MOS transistor N1. Signal D1 of an L level is output.

Consider the case where semiconductor device 101 does not output data. On the part of P channel MOS transistor P1, NAND gate G1 provides an output of an H level since output enable signal EN is at an L level. Inverter 24 provides an output of an H level. Therefore, P channel MOS transistor P1 is turned OFF.

On the part of N channel MOS transistor N1, the output of NOR gate G2 attains an L level, and the output of inverter 28 attains an L level. Therefore, N channel MOS transistor N1 is turned OFF. Since mode select signal LM is at an L level, the status of nodes ND2 and ND3 is similar to the above-described case of data output. PNP parasitic bipolar transistor QP1 and NPN parasitic bipolar transistor QN1 are both not turned ON.

Thus, output node ND1 attains a high impedance state since the two output transistors P1 and N1 are both OFF, and PNP and NPN parasitic bipolar transistors QP1 and QN1 are both not turned ON.

It is to be noted that, since P channel MOS transistor P2 is a thin film transistor formed at core circuitry 111, the breakdown voltage is of a concern since a power supply voltage VDDH of 3V at most will be applied to each node of the P channel MOS transistor. However, the source terminal, gate terminal and drain terminal of P channel MOS transistor P2 are all applied with power supply voltage VDDH of 3V, irrespective of signal D0 and output enable signal EN, since mode select signal LM is at an L level. This means that a voltage that exceeds 1V will not be applied across respective terminals of P channel MOS transistor P2. Thus, the problem of the breakdown voltage is absent even if P channel MOS transistor P2 is formed of a thin film transistor.

In a bipolar transistor, the clamp between the base and emitter is robust. Therefore, variation in the base voltage of NPN parasitic bipolar transistor QN1 is limited to the range of the ground level (GND) to the potential difference VBE (approximately 0.8V) between the base and emitter. This means that the voltage level at node ND3 only varies between the ground level (GND) to 0.8V even if the power supply voltage VDDH is of the conventional voltage level (3V type). Thus, inverter G9 formed of a thin film transistor can be employed as the circuit that drives node ND3.

In contrast, a thin film transistor cannot be used for the transistor that pulls down node ND2. N channel MOS transistor N2 formed of a thick film is employed. This is because a potential difference of 3V occurs between the source and drain of N channel MOS transistor N2 since node ND2 rises as high as 3V when the power supply voltage VDDH is of the conventional voltage level (3V type).

Thus, output drive circuit 131 operates as in a conventional manner when power supply voltage VDDH is of the conventional voltage level (3V type).

(2) When Power Supply Voltage VDDH is of a Low Voltage Level (1V):

Consider the case where semiconductor device 101 outputs data of an H level. On the part of P channel MOS transistor P1, the output of NAND gate G1 attains an L level, and the output of inverter 24 attains an L level. Therefore, P channel MOS transistor P1 is turned ON.

Since mode select signal LM is at an H level, level shift circuit 16 provides an output of an H level. Also, since inverter 22 provides an output of an H level, the output of NAND gate G5 is driven to an L level. Therefore, N channel MOS transistor N2 is turned ON. An H level output from level shift circuit 16 causes P channel MOS transistor P3 to be turned OFF, and an L level output from inverter 24 causes the output of NAND gate G10 to be driven to an H level, whereby P channel MOS transistor P2 is turned OFF. Therefore, node ND2 is driven to an L level (GND) by N channel MOS transistor N2. PNP parasitic bipolar transistor QP1 is turned ON, whereby output node ND1 is charged at high speed.

On the part of N channel MOS transistor N1, the output of NOR gate G2 attains an L level, and the output of inverter 28 attains an L level. Therefore, N channel MOS transistor N1 is turned OFF. Since the output of NOR gate G2 is at an L level, NAND gate G8 provides an output of an H level. Node ND3 is driven to an L level (GND) by inverter G9. NPN parasitic bipolar transistor QN1 is not turned ON.

Thus, output node ND1 is driven at high speed to an H level (VDDH) by PNP parasitic bipolar transistor QP1 of P channel MOS transistor P1. Signal D1 of an H level is output.

Consider the case where data of an L level is output from semiconductor device 101. On the part of P channel MOS transistor P1, the output of NAND gate G1 attains an H level, and the output of inverter 24 attains an H level. Therefore, P channel MOS transistor P1 is turned OFF.

An L level output from inverter 22 causes the output of NAND gate G5 to be driven to an H level, whereby N channel MOS transistor N2 is turned OFF. An H level output from level shift circuit 16 causes P channel MOS transistor P3 to be turned OFF, and an H level output from inverter 24 causes the output of NAND gate G10 to be driven to an L level. Therefore, P channel MOS transistor P2 is turned ON. Thus, node ND2 is driven to an H level (VDDH) by P channel MOS transistor P2. PNP parasitic bipolar transistor QP1 is not turned ON.

On the part of N channel MOS transistor N1, the output of NOR gate G2 attains an H level and the output of inverter 28 attains an H level, whereby N channel MOS transistor N1 is turned ON. Since mode select signal LM is at an H level and the output of NOR gate G2 attains an H level, NAND gate G8 provides an output of an L level. Therefore, node ND3 is driven to an H level (VDDH) by inverter G9. Output node ND1 is discharged at high speed in response to NPN parasitic bipolar transistor QN1 of N channel MOS transistor N1 being turned ON.

Thus, output node ND1 is driven at high speed to an L level by NPN parasitic bipolar transistor QN1 of N channel MOS transistor N1. Signal D1 of an L level is output.

Consider the case where data is not output from semiconductor device 101. On the part of P channel MOS transistor P1, NAND gate G1 provides an output of an H level since output enable signal EN is at an L level. The output of inverter 24 attains an H level, whereby P channel MOS transistor P1 is turned OFF.

Since the output of inverter 22 is at an L level, the output of NAND gate G5 attains an H level, whereby N channel MOS transistor N2 is turned OFF. Since inverter 24 provides an output of an H level and level shift circuit 16 provides an output of an H level, NAND gate G10 provides an output of an L level. Therefore, P channel MOS transistor P2 is turned ON. Node ND2 is driven to an H level (VDDH) by P channel MOS transistor P2. PNP parasitic bipolar transistor QP1 is not turned ON.

On the part of N channel MOS transistor N1, the output of NOR gate G2 attains an L level, and the output of inverter 28 attains an L level. Therefore, N channel MOS transistor N1 is turned OFF. Since an L level output is provided from NOR gate G2, the output of NAND gate G8 is driven to an H level. Node ND3 is driven to an L level (GND) by inverter G9. NPN parasitic bipolar transistor QN1 is not turned ON.

Thus, output node ND1 attains a high impedance state since the two output transistors P1 and N1 are both OFF, and PNP parasitic bipolar transistor QP1 and NPN parasitic bipolar transistor QN1 are both not turned ON.

When power supply voltage VDDH is of a low voltage level (1V), PNP parasitic bipolar transistor QP1 and NPN parasitic bipolar transistor QN1 charge and discharge output node ND1 at high speed. Therefore, output drive circuit 131 operates at high speed even if power supply voltage VDDH of interface circuitry 121 is of a low voltage level.

The above description is based on a structure where power supply voltage VDDH of a low voltage operation mode is set to 1V. However, power supply voltage VDDH in a low voltage operation mode is not limited to 1V, and may take any level in the range from the lowest voltage level (approximately 0.8V) where PNP and NPN parasitic bipolar transistors QP1 and QN1 are turned ON to the conventional voltage level (3V type).

According to semiconductor device 101 of the second embodiment, the circuit that drives the parasitic bipolar transistor is partially formed of a thin film transistor. Therefore, the charge and discharge speed of the base node of the parasitic bipolar transistors in a low voltage operation mode is improved, which in turned improves the operating speed. Furthermore, the circuit area is reduced.

Third Embodiment

In semiconductor device 101 of the previous second embodiment, N channel MOS transistor N2 of a thick film transistor is employed for the discharging of node ND2 which is the base node of PNP parasitic bipolar transistor QP1. Therefore, the operating speed in a low voltage operation mode is rate-determined by N channel MOS transistor N2. The potential rising time will become longer than the potential falling time of output node ND1 during a low voltage operation mode. Such a distortion in the voltage waveform will restrict the maximum operating frequency. The third embodiment is directed to improving the operating speed of PNP parasitic bipolar transistor QP1 by reducing the discharging period of time of node ND2.

Figure 4:
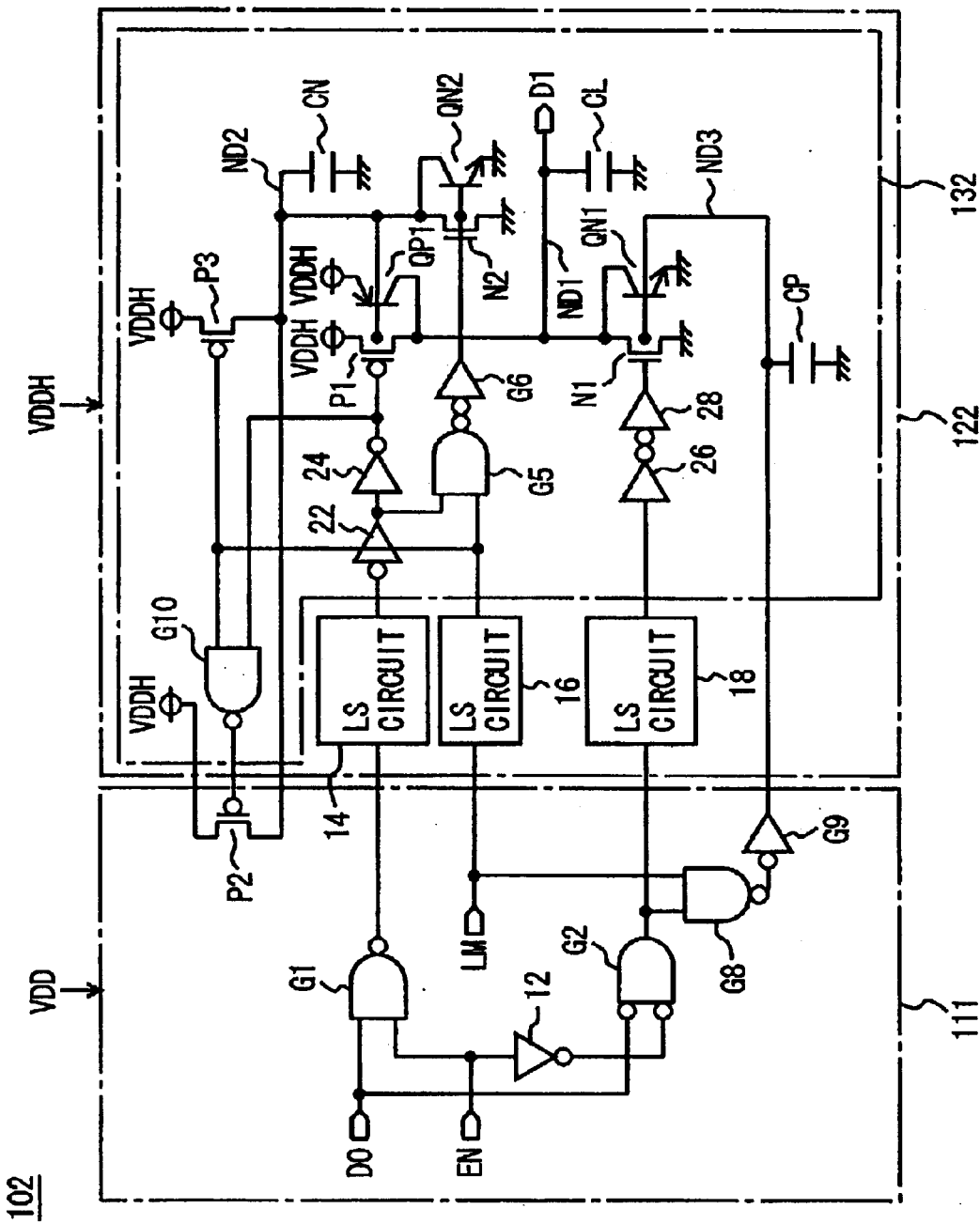

Referring to FIG. 4, a semiconductor device 102 according to the third embodiment of the present invention includes core circuitry 111, and interface circuitry 122. Interface circuitry 122 is based on the structure of interface circuitry 121 shown in FIG. 3, provided that an output drive circuit 132 is included instead of output drive circuit 131.

Output drive circuit 132 includes, according to the structure of output drive circuit 131, an NPN parasitic bipolar transistor QN2 of N channel MOS transistor N2, generated by connecting the output node of inverter G6 to the substrate of N channel MOS transistor N2.

The remaining circuit structure of interface circuitry 122 is similar to that of interface circuitry 121 shown in FIG. 3. Therefore, description thereof will not be repeated. Also, the description of the circuit structure of core circuitry 111 will not be repeated here since it has been already described in the previous second embodiment.

The operation of semiconductor device 102 of the third embodiment will be described hereinafter.

As described in the second embodiment, N channel MOS transistor N2 is turned ON only when the semiconductor device outputs data of an H level with power supply voltage VDDH of a low voltage level. In semiconductor device 102 of the third embodiment, NPN parasitic bipolar transistor QN2 is turned ON only when N channel MOS transistor N2 is turned ON. Therefore, the operation of semiconductor device 102 other than when data of an H level is output therefrom at a low voltage level of power supply voltage VDDH is similar to that of semiconductor device 101 of the second embodiment. Therefore, description thereof will not be repeated.

Consider the case where data of an H level is output from semiconductor device 102 with a low voltage level for power supply voltage VDDH. On the part of P channel MOS transistor P1, the output of NAND gate G1 attains an L level, and the output of inverter 24 attains an L level. P channel MOS transistor P1 is turned ON.

Since mode select signal LM is at an H level, level shift circuit 16 provides an output of an H level, and inverter 22 provides an output of an H level. Therefore, the output of NAND gate G5 is driven to an L level. Accordingly, the output of inverter G6 attains an H level, whereby N channel MOS transistor N2 is turned ON and NPN parasitic bipolar transistor QN2 is turned ON. In contrast, P channel MOS transistors P2 and P3 are both turned OFF, likewise the second embodiment. Therefore, node ND2 is driven at high speed to an L level (GND) by NPN parasitic bipolar transistor QN2. Output node ND1 is charged at high speed in response to PNP parasitic bipolar transistor QP1 being turned ON.

By discharging node ND2 which is the base node of PNP parasitic bipolar transistor QP1 at high speed by NPN parasitic bipolar transistor QN2, the potential rising time of output node ND1 is improved.

The above description is based on the case where power supply voltage VDDH in a low voltage operation mode is set to 1V. However, power supply voltage VDDH in a low voltage operation mode is not limited to 1V, and may take any voltage in the range from the lowest voltage level (approximately 0.8V) where PNP parasitic bipolar transistor QP1 and NPN parasitic bipolar transistors QN1 and QN2 are turned ON to the conventional voltage level (3V type).

According to semiconductor device 102 of the third embodiment, the base node of PNP parasitic bipolar transistor QP1 that pulls up output node ND1 at high speed can be discharged speedily by NPN parasitic bipolar transistor QN2, in the case where data of an H level is output in a low voltage operation mode. Therefore, the operating speed of PNP parasitic bipolar transistor QP1 is improved, which in turn improves the output speed of H level data in a low voltage operation mode. Distortion in the waveform of the output potential is eliminated, and the operating frequency can be further increased.

The current drivability of NPN parasitic bipolar transistor QN2 is high enough even if the area of N channel MOS transistor N2 is small. By virtue of reducing the area of N channel MOS transistor N2, the circuit area is reduced than that of the second embodiment.

Fourth Embodiment

In semiconductor device 102 of the previous third embodiment, NPN parasitic bipolar transistor QN2 is used for discharging node ND2 which is the base node of PNP parasitic bipolar transistor QP1. For the base drive of this NPN parasitic bipolar transistor QN2, inverter G6 formed of a thick film transistor is employed. In a low voltage operation mode, the driving capability of a thick film transistor will be degraded. In order to ensure sufficient drivability even under a low voltage, the size must be increased. In the previous third embodiment, inverter G6 is increased in size.

It is to be noted that the base potential of the NPN parasitic bipolar transistor varies from the ground level (GND) to the level of the potential difference VBE (approximately 0.8V) between the base and emitter, as described in the second embodiment. Therefore, a thin film transistor can be used for driving the base of NPN parasitic bipolar transistor QN2.

Figure 5:
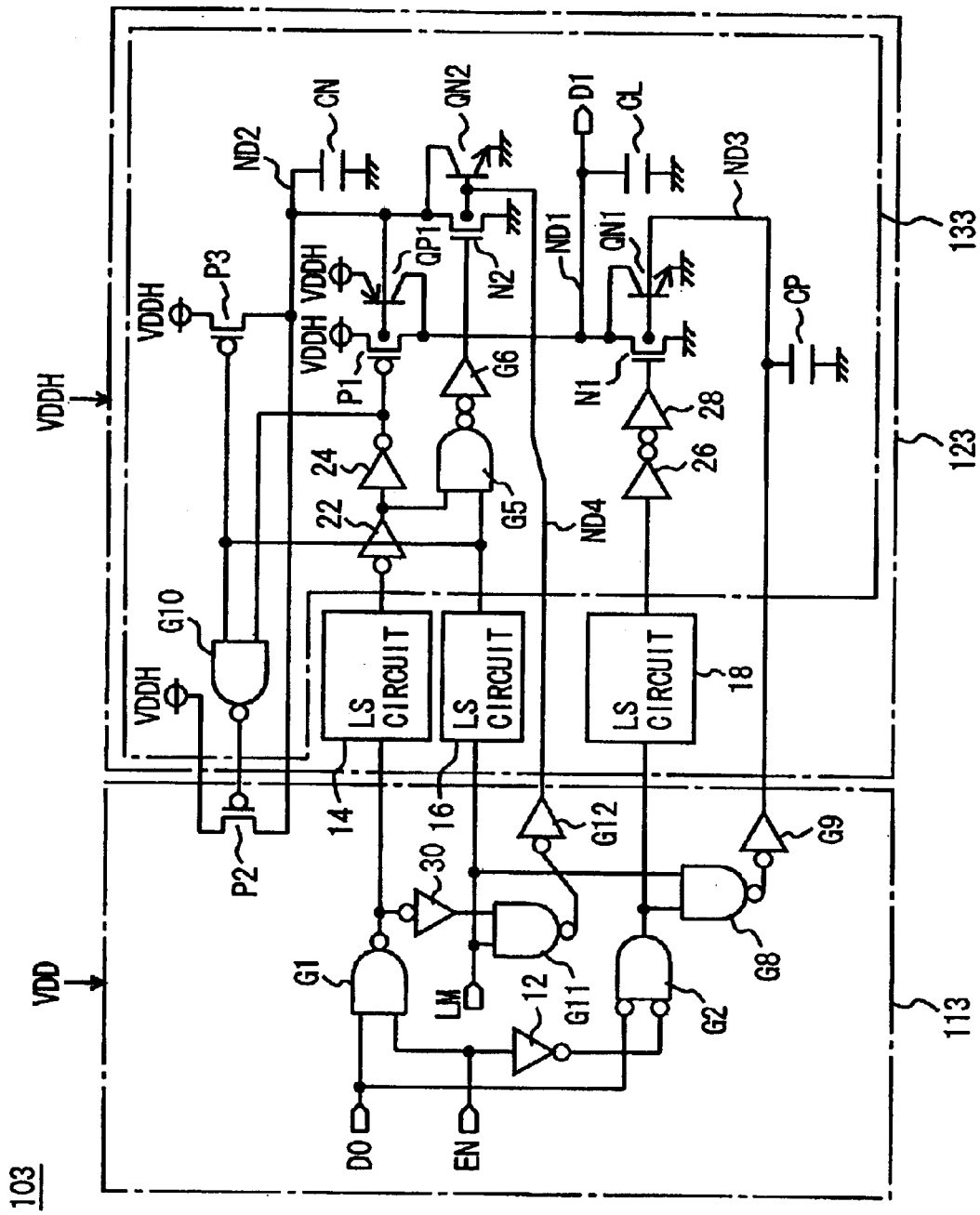

Referring to FIG. 5, a semiconductor device 103 according to the fourth embodiment includes core circuitry 113, and interface circuitry 123.

Core circuitry 113 includes, in addition to the structure of core circuitry 111 of FIG. 4, an inverter 30 inverting the output of NAND gate G1, a NAND gate G11 receiving the output of inverter 30 and mode select signal LM, and an inverter G12 inverting the output of NAND gate G11 to provide the inverted output to a node ND4.

The remaining circuit structure of core circuitry 113 is similar to that of core circuitry 111 of FIG. 4. Therefore, description thereof will not be repeated.

Interface circuitry 123 is based on the structure of inverter circuit 122 shown in FIG. 4, provided that an output drive circuit 133 is substituted for output drive circuit 132.

In output drive circuit 133, node ND4 is connected to the substrate of N channel MOS transistor N2. Node ND4 is connected to the output node of inverter G12 in core circuitry 113, as described above.

The remaining circuit structure of interface circuitry 123 is similar to that of interface circuitry 122 of FIG. 4. Therefore, description thereof will not be repeated.

The operation of semiconductor device 103 will be described here.

(1) When Power Supply Voltage VDDH is of the Conventional Voltage Level (3V Type):

Since mode select signal LM is at an L level when power supply voltage VDDH is of the conventional voltage level, the output of NAND gate G11 attains an H level. Node ND4 is driven to an L level by inverter G12. Thus, NPN parasitic bipolar transistor QN2 will not be turned ON whatever the status of signal D0 and output enable signal EN may be. Semiconductor device 103 of the fourth embodiment operates in a manner similar to that of semiconductor device 102 of the third embodiment.

(2) When Power Supply Voltage VDDH is of the Low Voltage Level (1V):

When semiconductor device 103 outputs data of an L level, the output of NAND gate G1 attains an H level, and the output of inverter 30 attains an L level. In response, NAND gate G11 provides an output of an H level. Node ND4 is driven to an L level by inverter G12. Therefore, NPN parasitic bipolar transistor QN2 is not turned ON. Semiconductor device 103 operates in a manner similar to that of semiconductor device 102 of the third embodiment.

When semiconductor device 103 provides data of an H level, the output of NAND gate G1 attains an L level, and the output of inverter 30 attains an H level. Since mode select signal LM is at an H level, NAND gate G11 provides an output of an L level. The output of inverter G12 is driven to an H level (VDD). Therefore, NPN parasitic bipolar transistor QN2 is driven by inverter G12 formed of a thin film transistor that has a drivability greater than that of a thick film transistor in a low voltage operation mode to be turned ON at high speed.

When NPN parasitic bipolar transistor QN2 is ON, node ND2 can be discharged sufficiently even if discharge of node ND2 by N channel MOS transistor N2 itself is absent. Therefore, the gate of N channel MOS transistor N2 can be fixed at the ground level (GND). Also, NAND gate G5 and inverter G6 can be removed. Accordingly, the driving current of N channel MOS transistor N2 can be reduced. Furthermore, removal of NAND gate G5 and inverter G6 results in reduction of the circuit area.

The above description is based on a structure in which power supply voltage VDDH in a low voltage operation mode is set to 1V. However, power supply voltage VDDH in a low voltage operation mode is not limited to 1V, and can be set to any level in the range from the lowest voltage level (approximately 0.8V) where PNP parasitic bipolar transistor QP1 and NPN parasitic bipolar transistors QN1 and QN2 are turned ON to the conventional voltage level (3V type).

According to semiconductor device 103 of the fourth embodiment, NPN parasitic bipolar transistor QN2 that discharges the base node of PNP parasitic bipolar transistor QP1 pulling up output node ND1 at high speed can be driven speedily by inverter G12 formed of a thin film transistor when data of an H level is output in a low voltage operation mode. Eventually, the operating speed of PNP parasitic bipolar transistor QP1 is improved. Thus, the output speed of H level data in a low voltage operation mode is improved.

Also, the driving current of N channel MOS transistor N2 can be reduced since the gate of N channel MOS transistor N2 that discharges the base node of PNP parasitic bipolar transistor QP1 can be fixed to the ground level.

Furthermore, even if a gate circuit formed of a thin film transistor to drive NPN parasitic bipolar transistor QN2 is newly added, the gate circuit formed of a thick film transistor to drive N channel MOS transistor N2 per se can be removed by fixing the gate of N channel MOS transistor N2 to the ground level. Thus, the overall circuit area can be reduced.

Fifth Embodiment

In the previous first to fourth embodiments, the outputs of NAND gates G1 and G2 as well as mode select signal LM are provided to the output drive circuit via a level shift circuit even in the case where power supply voltage VDDH of interface circuitry is of a voltage level (for example 1V) close to the level of power supply voltage VDD of core circuitry.

It is to be noted that, particularly in the third embodiment shown in FIG. 4, NPN parasitic bipolar transistor QN1 corresponding to the pull-down of output node ND1 is directly driven based on a signal output from core circuitry 111, whereas NPN parasitic bipolar transistor QN2 corresponding to the pull-up of output node ND1 is driven based on a signal via level shift circuits 14 and 16. Therefore, the rising period of time of the output potential of output node ND1 will become greater than the falling period of time thereof.

The level shift circuit serves to convert the potential amplitude of the signal received from core circuitry to comply with the potential amplitude of interface circuitry when the power supply voltage differs between the core circuitry and the interface circuitry. Therefore, the level shift circuit is not required when the potential amplitude of the signals in core circuitry and interface circuitry is substantially equal. In the present fifth embodiment, when power supply voltage VDDH of interface circuitry is set to 1V that is close to the level of power supply voltage VDD of core circuitry, a signal output from core circuitry is provided to the output drive circuit of interface circuitry without passing through the level shift circuit.

Figure 6:
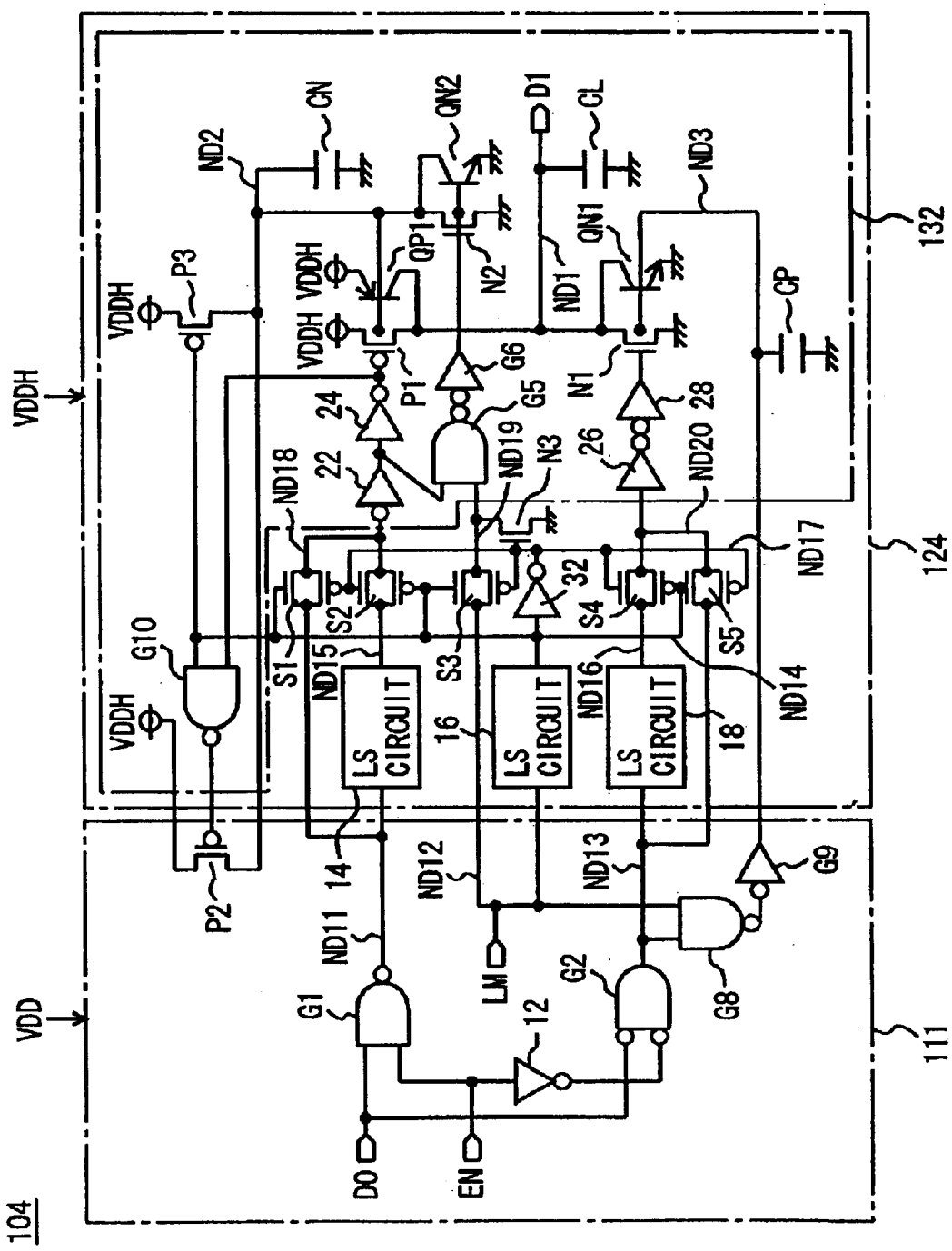

Referring to FIG. 6, a semiconductor device 104 according to the fifth embodiment includes core circuitry 111 and interface circuitry 124.

Interface circuitry 124 includes, in addition to the structure of interface circuitry 122 of FIG. 4, switches S1–S5, an inverter 32 receiving and inverting the signal output to a node ND14 from level shift circuit 16 and providing the inverted output to a node ND17, and an N channel MOS transistor N3 connected to a node ND19 and the ground node, and having its gate connected to node ND17.

Switch S1 is connected to nodes ND11 and ND18, and turned ON when the signal output at node ND14 from level shift circuit 16 is at an H level, i.e., when mode select signal LM is at an H level, and turned OFF when mode select signal LM is at an L level.

Switch S2 is connected to nodes ND15 and ND18, and turned ON when the signal output at node ND14 from level shift circuit 16 is at an L level, i.e., when mode select signal LM is at an L level, and turned OFF when mode select signal LM is at an H level.

Switch S3 is connected to nodes ND12 and ND 19, and turned ON when mode select signal LM is at an H level, and turned OFF when mode select signal LM is at an L level, likewise switch S1.

Switch S4 is connected to nodes ND16 and ND20, and turned ON when mode select signal LM is at an L level, and turned OFF when mode select signal LM is at an H level, likewise switch S2.

Switch S5 is connected to nodes ND13 and ND20, and turned ON and OFF when mode select signal LM is at an H level and an L level, respectively, likewise switches S1 and S3.

The remaining circuit structure of interface circuitry 124 is similar to that of interface circuitry 122 shown in FIG. 4. Therefore, description thereof will not be repeated. Also, the description of the circuit structure of core circuitry 111 is not repeated since it is already described in the second embodiment.

The operation of semiconductor device 103 will be described hereinafter.

(1) When Power Supply Voltage VDDH is of a Conventional Voltage Level (3V Type):

Since mode select signal LM is at an L level, switches S1, S3 and S5 are turned OFF, whereas switches S2 and S4 are turned ON. Therefore, the output of NAND gate G1 is provided to inverter 22 via level shift circuit 14 and switch S2. The output of NOR gate G2 is provided to inverter 26 via level shift circuit 18 and switch S4.

Since mode select signal LM is at an L level, the output of inverter 32 attains an H level, whereby N channel MOS transistor N3 is turned ON. Therefore, node ND19 attains an L level, and the output of NAND gate G5 attains an H level. N channel MOS transistor N2 and NPN parasitic bipolar transistor QN2 are turned OFF. Thus, output drive circuit 132 operates in a manner similar to that of the third embodiment when power supply voltage VDDH is of a conventional voltage level (3V type).

(2) When Power Supply Voltage VDDH is of a Low Voltage Level (1V):

Since mode select signal LM is at an H level, switches S1, S3 and S5 are turned ON whereas switches S2 and S4 are turned OFF. Therefore, the output of NAND gate G1 is provided to inverter 22 via switch S1, bypassing level shift circuit 14. The output of NOR gate G2 bypasses level shift circuit 18 to be provided to inverter 26 via switch S5.

Since mode select signal LM is at an L level, inverter 32 provides an output of an L level. N channel MOS transistor N3 is turned OFF, whereby node ND19 attains an H level. Therefore, output drive circuit 132 operates in a manner similar to that of the third embodiment when power supply voltage VDDH is of a low voltage level.

The rising time of the output potential of output node ND1 is improved since NPN parasitic bipolar transistor QN2 corresponding to the pull-up of output node ND1 is driven based on a signal that bypasses level shift circuits 14 and 16 when power supply voltage VDDH is of a low voltage level.

According to semiconductor device 104 of the fifth embodiment, the signal output from core circuitry 111 is supplied to output drive circuit 132 without passing through the level shift circuit when power supply voltage VDDH of interface circuitry 124 is of a level close to power supply voltage VDD of core circuitry 111. Therefore, the rising property of the output voltage of output node ND1 is particularly improved.

Sixth Embodiment

In the previous first to fifth embodiments, 3V or 3.3V is envisaged as the conventional voltage and 1V is envisaged as the low voltage for the power supply voltage VDDH of interface circuitry. Since the drivability of a thick film transistor becomes extremely small when power supply voltage VDDH is at the level of 1V, a thin film transistor is employed for the drive of the parasitic bipolar transistor.

In the case where power supply voltage VDDH is of a level between 1V and the conventional voltage level such as 2V, the thick film transistor will have drivability of a relative level. In contrast to the case where power supply voltage VDDH is 1V, the parasitic bipolar transistor needs to function only subsidiarily, as compared to the case where power supply voltage VDDH is 1V. If the drivability by the parasitic bipolar transistor is too small, the above-described high speed operation cannot be accommodated. In contrast, if the drivability by the parasitic bipolar transistor is too large, over shooting or under shooting occurs in the output potential. The stabilization time of the output potential will become longer to cause erroneous operation. Therefore, the drivability by the parasitic bipolar transistor is desirably set to an appropriate level based on power supply voltage VDDH. In the present sixth embodiment, a plurality of circuits driving the parasitic bipolar transistor are provided. The parasitic bipolar transistor is driven under the optimum condition based on power supply voltage VDDH.

Figure 7:
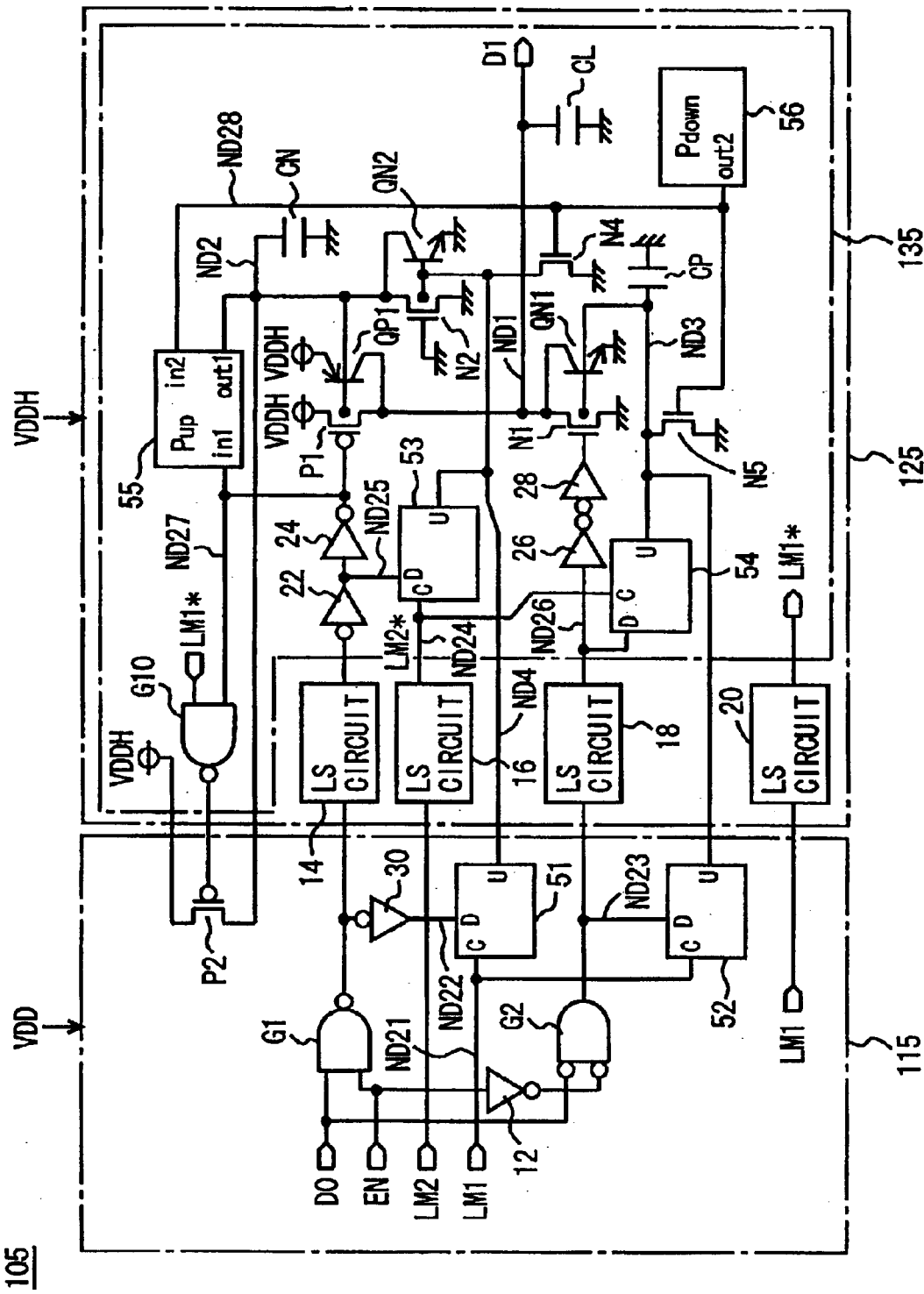

Referring to FIG. 7, a semiconductor device 105 of the sixth embodiment includes core circuitry 115, and interface circuitry 125.

Core circuitry 115 is based on the structure of core circuitry 113 of semiconductor device 103 of the fourth embodiment shown in FIG. 5, and includes a base drive circuit 51 driving the base node of NPN parasitic bipolar transistor QN2, instead of NAND gate G11 and inverter G12, and a base drive circuit 52 driving the base node of NPN parasitic bipolar transistor QN1, instead of NAND gate G8 and inverter G9.

The internal circuit (not shown) of core circuitry 115 sets two mode select signals LM1 and LM2. The internal circuit sets mode select signals LM1 and LM2 to an H level and an L level, respectively, when power supply voltage VDDH received at interface circuitry 125 is 1V, and to an L level and an H level, respectively, when power supply voltage VDDH is-of an intermediate voltage (for example 2V) between 1V and the conventional voltage. Also, the internal circuit sets mode select signals LM1 and LM2 both to an L level when power supply voltage VDDH is of the conventional voltage level (3V type).

Base drive circuits 51 and 52 are formed of thin film transistors, and receive power supply voltage VDD to operate. Base drive circuits 51 and 52 are rendered active when mode select signal LM1 applied to an input node C is of an H level to drive an output node U according to the signal applied to an input node D. Base drive circuits 51 and 52 set output node U at a high impedance state when mode select signal LM1 applied to input node C is of an L level, irrespective of the state of the signal applied to input node D.

The remaining circuit structure of core circuitry 115 is similar to that of core circuitry 113 of FIG. 5. Therefore, description thereof will not be repeated.

Interface circuitry 125 is based on the structure of interface circuitry 123 shown in FIG. 5, and further includes a level shift circuit 20, and also an output drive circuit 135 instead of output drive circuit 133.

Level shift circuit 20 receives mode select signal LM1 output from the internal circuit (not shown) of core circuitry 115, and provides a mode select signal LM1* to output drive circuit 135. Mode select signal LM1* has the potential amplitude converted according to power supply voltage VDDH.

Output drive circuit 135 is based on the structure of output drive circuit 133, and includes a base drive circuit 53 that drives the base node of NPN parasitic bipolar transistor QN2, instead of NAND gate G5 and inverter G6. The gate of N channel MOS transistor N2 is connected to the ground node. Output drive circuit 135 includes a base drive circuit 54 driving the base node of NPN parasitic bipolar transistor QN1.

Output drive circuit 135 is based on the structure of output drive circuit 133, and includes a pullup circuit 55 driving the base node of PNP parasitic bipolar transistor QP1 to an H level (VDDH), and a pulldown circuit 56 providing a signal to drive the base nodes of NPN parasitic bipolar transistors QN1 and QN2 to an L level (GND), as a substitute for P channel MOS transistor P3.

Output drive circuit 135 further includes N channel MOS transistors N4 and N5 receiving output of pulldown circuit 56 to drive the base nodes of NPN parasitic bipolar transistors QN2 and QN1 to an L level when the received signal is at an H level. In output drive circuit 135, NAND gate G10 receives the output of inverter 24 and mode select signal LM1*.

Base drive circuits 53 and 54, pullup circuit 55, pulldown circuit 56, and N channel MOS transistors N4 and N5 are all formed of thick film transistors since they are included in interface circuitry 125, and receive power supply voltage VDDH to operate.

Base drive circuits 53 and 54 are rendered active when mode select signal LM2* applied to input node C and corresponding to mode select signal LM2 having the potential amplitude converted by level shift circuit 16 is of an H level, and drives output node U according to the signal applied to input node D. Base drive circuits 53 and 54 set output node U to a high impedance state, irrespective of the status of the signal applied to input node D, when mode select signal LM2* applied to input node C is of an L level.

Pulldown circuit 56 outputs a signal of an H level and a signal of an L level to a node ND28 when both mode select signals LM1* and LM2* are of an L level, i.e. when power supply voltage VDDH is of the conventional voltage level (3V type), and when at least one of mode select signals LM1* and LM2* is of an H level, respectively. Accordingly, N channel MOS transistors N4 and N5 are turned ON when power supply voltage VDDH is of the conventional voltage level (3V type). Nodes ND4 and ND3 which are the base nodes of NPN parasitic bipolar transistors QN2 and QN1 are pulled down to an L level.

When the signal on node ND28 applied to an input node in2 is of an H level, pullup circuit 55 pulls up node ND2 to an H level (VDDH). When mode select signal LM2* is at an H level and the signal on a node ND27 applied to an input node in1 is at an H level, i.e., when power supply voltage VDDH is of an intermediate voltage level (2V) and P channel MOS transistor P1 is OFF, pullup circuit 55 pulls up node ND2 to an H level (VDDH).

In contrast, when mode select signal LM1* is at an H level and the signal on node ND27 is at an H level, i.e., when power supply voltage VDDH is 1V and P channel MOS transistor P1 is OFF, the output of NAND gate G10 is driven to an L level. Therefore, P channel MOS transistor P2 in core circuitry 115 is turned ON. P channel MOS transistor P2 pulls up node ND2 to an H level (VDDH).

In other words, when power supply voltage VDDH is of a low voltage level (1V), node ND2 is pulled up to an H level (VDDH) by P channel MOS transistor P2 which is a thin film transistor. When power supply voltage VDDH is of an intermediate voltage level (2V), node ND2 is pulled up to an H level (VDDH) by pullup circuit 55 formed of a thick film transistor.

The remaining structure of output drive circuit 135 is similar to that of output drive circuit 133 shown in FIG. 5. Therefore description thereof will not be repeated.

Figure 8:
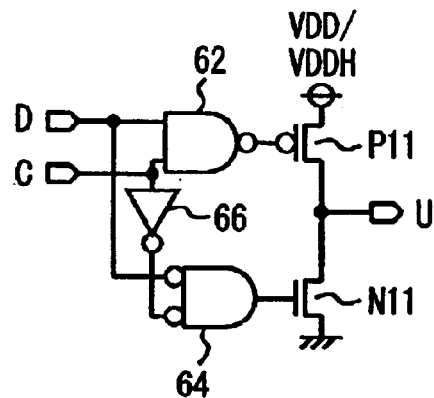
FIG. 8 is a circuit diagram of a structure of the base drive circuit shown in FIG. 7.

FIG. 8 is a circuit diagram showing a structure of base drive circuits 51–54. Referring to FIG. 8, base drive circuits 51–54 each include a NAND gate 62 receiving the signals on input nodes C and D, an inverter 66 inverting the signal on input node C, a NOR gate 64 receiving the signal on input node D and the output of inverter 66, a P channel MOS transistor P11 connected to the power supply node and output node U to receive the output of NAND gate 62 at its gate, and an N channel MOS transistor N11 connected to output node U and the ground node to receive the output of NOR gate 64 at its gate.

In base drive circuits 51 and 52, P channel MOS transistor P11 is connected to power supply node VDD. In contrast, in base drive circuits 53 and 54, P channel MOS transistor P11 is connected to power supply node VDDH.

Base drive circuits 51–54 each are rendered active when the signal on input node C is at an H level. When the signal on input node D is at an H level, the outputs of NAND gate 62 and NOR gate 64 are both driven to an L level. Therefore, P channel MOS transistor P11 and N channel MOS transistor N11 are turned ON and OFF, respectively. Output node U is driven to an H level. In contrast, when the signal on input node D is at an L level, the outputs of NAND gate 62 and NOR gate 64 both attain an H level. Therefore, P channel MOS transistor P11 and N channel MOS transistor N11 are turned OFF and ON, respectively. Output node U is driven to an L level.

Figure 9:
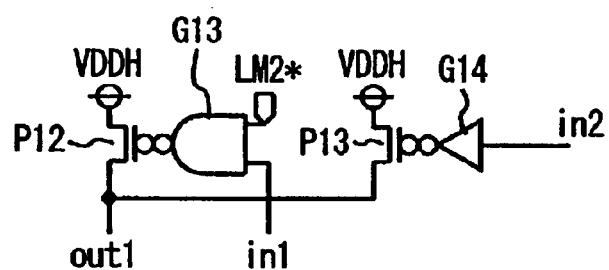
FIG. 9 is a circuit diagram of a structure of the pullup circuit shown in FIG. 7.

FIG. 9 shows a structure of pullup circuit 55. Referring to FIG. 9, pullup circuit 55 includes an inverter G14 inverting the signal on input node in2, a P channel MOS transistor P13 connected to power supply node VDDH and an output node out to receive the output of inverter G14 at its gate, a NAND gate G13 receiving mode select signal LM2* and the signal on input node in1, and a P channel MOS transistor P12 connected to power supply node VDDH and output node out1 to receive the output of NAND gate G13 at its gate.

In pullup circuit 55, an H level signal on input node in2 causes P channel MOS transistor P13 to be turned ON, whereby output node out1 is pulled up to an H level (VDDH). When mode select signal LM2* and the signal on input node in1 are both at an H level, NAND gate G13 provides an output of an L level. Therefore, P channel MOS transistor P12 is turned ON, whereby output node out1 is pulled up to an H level (VDDH).

Figure 10:
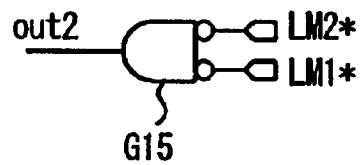
FIG. 10 is a circuit diagram showing a structure of the pulldown circuit shown in FIG. 7.

FIG. 10 shows a structure of pulldown circuit 56. Referring to FIG. 10, pulldown circuit 56 is formed of a NOR gate G15. Pulldown circuit 56 provides a signal of an H level to output node out2 when mode select signals LM1* and LM2* are both at an L level.

The operation of semiconductor device 105 will be described hereinafter with reference to FIG. 7 again.

(1) When Power Supply Voltage VDDH is of a Conventional Voltage Level (3V Type):

The internal circuit (not shown) of core circuitry 115 sets mode select signals LM1 and LM2 both to an L level. Therefore, pulldown circuit 56 provides an output of an H level, whereby N channel MOS transistors N4 and N5 are turned ON. Nodes ND4 and ND3 are pulled down to an L level. Neither NPN parasitic bipolar transistor QN2 nor QN1 is turned ON. Since a signal of an H level is applied to input node in2 of pullup circuit 55, node ND2 is pulled up to an H level (VDDH) by pullup circuit 55. PNP parasitic bipolar transistor QP1 is not turned ON.

Thus, when power supply voltage VDDH is of the conventional voltage level (3V type), none of the parasitic bipolar transistors are turned ON. P channel MOS transistor P1 and N channel MOS transistor N1 operate as a normal P channel MOS transistor and N channel MOS transistor, respectively.

(2) When Power Supply Voltage VDDH is of a Low Voltage Level (1V):

On this occasion, the internal circuit sets mode select signals LM1 and LM2 to an H level and an L level, respectively. Therefore, base drive circuits 51 and 52 formed of thin film transistors are activated.

First, consider the case where semiconductor device 105 outputs data of an H level. On the part of P channel MOS transistor P1, the output of NAND gate G1 attains an L level, and input node D of base drive circuit 51 attains an H level. Therefore, base drive circuit 51 provides an output of an H level. Since the output of pulldown circuit 56 is at an L level, N channel MOS transistor N4 is turned OFF. Also, since mode select signal LM2* is at an L level, output node U of base drive circuit 53 attains a high impedance state. Therefore, node ND4 is driven to an H level by base drive circuit 51. NPN parasitic bipolar transistor QN2 is turned ON at high speed.

Since the outputs of pulldown circuit 56 and inverter 24 both attain an L level, pullup circuit 55 does not pull up node ND2 to an H level. Also, P channel MOS transistor P2 is not turned ON since NAND gate G10 provides an output of an H level. Therefore, node ND2 will not be pulled up to an H level. Thus, node ND2 is pulled down to an L level at high speed by NPN parasitic bipolar transistor QN2. PNP parasitic bipolar transistor QP1 is turned ON at high speed.

On the part of N channel MOS transistor N1, NOR gate G2 provides an output of an L level. Since input node D of base drive circuit 52 attains an L level, the output of base drive circuit 52 is driven to an L level. Also, since mode select signal LM2* is at an L level, output node U of base drive circuit 54 attains a high impedance state. Therefore, node ND3 is driven to an L level by base drive circuit 52. NPN parasitic bipolar transistor QN1 will not be turned ON.

Thus, output node ND1 is driven to an H level at high speed in response to PNP parasitic bipolar transistor QP1 turned ON at high speed.

Consider the case where semiconductor device 105 provides data of an L level. On the part of P channel MOS transistor P1, the output of NAND gate G1 attains an H level, and input node D of base drive circuit 51 attains an L level. Therefore, base drive circuit 51 provides an output of an L level. Also, output node U of base drive circuit 53 attains a high impedance state since mode select signal LM2* is at an L level. Therefore, node ND4 is driven to an L level by base drive circuit 51. NPN parasitic bipolar transistor QN2 is not turned ON.

Since pulldown circuit 56 provides an output of an L level and mode select signal LM2* is at an L level, pullup circuit 55 does not pull up node ND2 to an H level. Since mode select signal LM1* is at an H level and inverter 24 provides an output of an H level, the output of NAND gate G10 is driven to an L level. P channel MOS transistor P2 is turned ON. Therefore, node ND2 is pulled up to an H level speedily by P channel MOS transistor P2 which is a thin film transistor. PNP parasitic bipolar transistor QP1 is turned OFF at high speed.

On the part of N channel MOS transistor N1, the output of NOR gate G2 attains an H level. Input node D of base drive circuit 52 attains an H level. Base drive circuit 52 provides an output of an H level. Also, pulldown circuit 56 provides an output of an L level, whereby N channel MOS transistor N5 is turned OFF. Since mode select signal LM2* is at an L level, output node U of base drive circuit 54 attains a high impedance state. Therefore, node ND3 is driven to an H level at high speed by base drive circuit 52 formed of a thin film transistor. NPN parasitic bipolar transistor QN1 is turned ON speedily.

Thus, output node ND1 is driven to an L level at high speed in response to NPN parasitic bipolar transistor QN1 being turned ON at high speed.

Consider the case where semiconductor device 105 does not output data. Since output enable signal EN is set at an L level, input node D of base drive circuits 51 and 52 both attain an L level. Base drive circuits 51 and 52 both provide outputs of an L level. The output nodes of base drive circuits 53 and 54 both attain a high impedance state. Therefore, nodes ND4 and ND3 are driven to an L level by base drive circuits 51 and 52, respectively. Neither NPN parasitic bipolar transistor QN2 nor QN1 is turned ON. Since the output of inverter 24 and mode select signal LM1* are both at an H level, the output of NAND gate G10 attains an L level. P channel MOS transistor P2 is turned ON. Therefore, PNP parasitic bipolar transistor QP1 will not be turned ON since node ND2 is driven to an H level by P channel MOS transistor P2.

When output enable signal EN is at an L level, P channel MOS transistor P1 and N channel MOS transistor N1 are both turned OFF, likewise the above-described embodiments.

Thus, output node ND1 attains a high impedance state since P channel MOS transistor P1, N channel MOS transistor N2, and all the parasitic bipolar transistors are turned OFF.

Thus, each parasitic bipolar transistor is driven speedily by base drive circuits 51 and 52 and P channel MOS transistor P2 formed of thin film transistors when power supply voltage VDDH is at a low voltage level (1V).

(3) When Power Supply Voltage VDDH is of an Intermediate Voltage Level (2V):

On this occasion, the internal circuit sets mode select signals LM1 and LM2 to an L level and the H level, respectively, whereby base drive circuits 53 and 54 formed of thick film transistors are rendered active.

Consider the case where semiconductor device 105 outputs data of an H level. On the part of P channel MOS transistor P1, the output of NAND gate G1 attains an L level, and the output of inverter 22 attains an H level. Therefore, input node D of base drive circuit 53 is driven to an H level, and the output of base drive circuit 53 is driven to an H level.

Also, pulldown circuit 56 provides an output of an L level. N channel MOS transistor N4 is turned OFF. Also, output node U of base drive circuit 51 attains a high impedance state since mode select signal LM1 attains an L level. Therefore, node ND4 is driven to an H level under an appropriate condition by base drive circuit 53, whereby NPN parasitic bipolar transistor QN2 is turned ON at high speed.

Since the outputs of pulldown circuit 56 and inverter 24 both attain an L level, pullup circuit 55 does not pull up node ND2 to an H level. Also, P channel MOS transistor P2 is not turned ON since NAND gate G10 provides an output of an H level. Therefore, node ND2 is not pulled up to an H level. Thus, node ND2 is pulled down to an L level at high speed by NPN parasitic bipolar transistor QN2. PNP parasitic bipolar transistor QP1 is turned ON at high speed.

On the part of N channel MOS transistor N1, NOR gate G2 provides an output of an L level. Level shift circuit 18 provides an output of an L level. Therefore, input node D of base drive circuit 54 is driven to an L level. Base drive circuit 54 provides an-output of an L level. Also, since mode select signal LM1 is at an L level, output node U of base drive circuit 52 attains a high impedance state. Thus, node ND3 is driven to an L level by base drive circuit 54. NPN parasitic bipolar transistor QN1 is not turned ON.

Thus, output node ND1 is driven to an H level speedily in response to PNP parasitic bipolar transistor QP1 being turned ON at high speed.

Consider the case where semiconductor device 105 provides data of an L level. On the part of P channel MOS transistor P1, NAND gate G1 provides an output of an H level. Inverter 22 provides an output of an L level. Therefore, input node D of base drive circuit 53 attains an L level. Base drive circuit 53 provides an output of an L level. Also, output node U of base drive circuit 51 attains a high impedance state since mode select signal LM1 is at an L level. Therefore, node ND4 is driven to an L level by base drive circuit 53. NPN parasitic bipolar transistor QN2 is not turned ON.

Since mode select signal LM1* is at an L level, NAND gate G10 provides an output of an H level. P channel MOS transistor P2 is turned OFF. Since the output of inverter 24 and mode select signal LM2* are both at an H level, pullup circuit 55 pulls up node ND2 to an H level. Therefore, node ND2 is pulled up to an H level at an appropriate condition by pullup circuit 55 formed of a thick film transistor. PNP parasitic bipolar transistor QP1 is turned OFF at high speed.

On the part of N channel MOS transistor N1, NOR gate G2 provides an output of an H level, and level shift circuit 18 provides an output of an H level. Therefore, input node D of base drive circuit 54 attains an H level. Base drive circuit 54 provides an output of an H level. Also, pulldown circuit 56 provides an output of an L level. N channel MOS transistor N5 is turned OFF. Furthermore, output node U of base drive circuit 52 attains a high impedance state since mode select signal LM1 is at an L level. Therefore, node ND3 is driven to an H level under an appropriate condition by base drive circuit 54 formed of a thick film transistor. NPN parasitic bipolar transistor QN1 is turned ON speedily.

Thus, output node ND1 is driven to an L level at high speed in response to NPN parasitic bipolar transistor QN1 turned ON at high speed.

Consider the case where semiconductor device 105 does not output data. Since output enable signal EN is set at an L level, input nodes D of base drive circuits 53 and 54 both attain an L level. Base drive circuits 53 and 54 both output an L level. Also, the output nodes of base drive circuits 51 and 52 both attain a high impedance state since mode select signal LM1 is at an L level. Therefore, neither NPN parasitic bipolar transistor QN1 nor QN2 is turned ON.

Since mode select signal LM1* is at an L level, NAND gate G10 provides an output of an H level. P channel MOS transistor P2 is turned OFF. Since the output of inverter 24 and mode select signal LM2* are both at an H level, pullup circuit 55 pulls up node ND2 to an H level. Therefore, node ND2 is pulled up to an H level by pullup circuit 55 formed of a thick film transistor. PNP parasitic bipolar transistor QP1 is not turned ON.

When output enable signal EN is at an L level, P channel MOS transistor P1 and N channel MOS transistor N1 are both turned OFF, likewise each of the above-described embodiments.

Thus, output node ND1 attains a high impedance state since P channel MOS transistor P1, N channel MOS transistor N2, and all parasitic bipolar transistors are turned OFF.

Thus, when power supply voltage VDDH is of an intermediate voltage level (2V), each parasitic bipolar transistor is driven at high speed under an appropriate condition by base drive circuits 53 and 54 and pullup circuit 55 formed of thick film transistors.

The above description is based on a structure in which power supply voltage VDDH in a low voltage operation mode is set to 1V and power supply voltage VDDH in an intermediate voltage operation mode is set to 2V. However, the power supply voltage VDDH is not limited to 1V and 2V, and can be set to an appropriate level in a range from the lowest voltage (approximately 0.8V) where PNP parasitic bipolar transistor QP1 and NPN parasitic bipolar transistors QN1 and QN2 are turned ON to the conventional voltage level (3V type).

According to semiconductor device 105 of the sixth embodiment, the drivability of the output driver can be selected appropriately in accordance with power supply voltage VDDH when power supply voltage VDDH received by interface circuitry 135 is lower than the conventional voltage level (3V type). Thus, the parasitic bipolar transistor can be driven at an appropriate condition in accordance with power supply voltage VDDH. Output node ND1 can be driven at an optimum condition.

Seventh Embodiment

The previous first to sixth embodiments are based on a structure in which mode select signals LM or LM1 and LM2 are set by the above-described internal circuitry based on an externally applied designation. In the semiconductor device of the present seventh embodiment, mode select signal LM or LM1 and LM2 are internally generated automatically based on power supply voltage VDDH received at interface circuitry.

The entire structure of the semiconductor device of the seventh embodiment is similar to that of semiconductor device 100 of the first embodiment shown in FIG. 2. Therefore description thereof is not repeated here.

Figure 11:
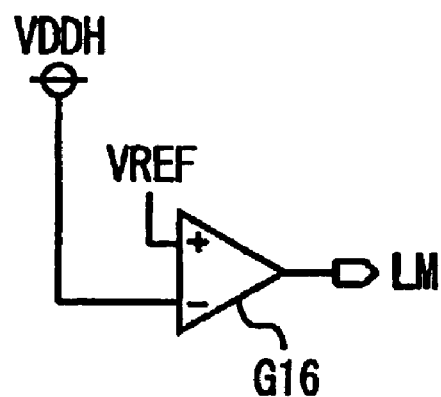
FIG. 11 is a circuit diagram of a structure of a mode select circuit included in a semiconductor device according to a seventh embodiment.

FIG. 11 shows the structure of a mode select circuit provided in the semiconductor device of the seventh embodiment.

Referring to FIG. 11, a mode select circuit 200 is included in the internal circuit of core circuitry 110 not shown. Mode select circuit 200 includes an amplifier G16 receiving power supply voltage VDDH and a reference voltage VREF to output a mode select signal LM according to a comparison result between the voltages.

Amplifier G16 compares power supply voltage VDDH to reference voltage VREF to output a mode select signal of an H level (VDD) when power supply voltage VDDH is lower than reference voltage VREF. Reference voltage VREF is set to a voltage level higher than 1V and lower than the conventional voltage level (3V type) in the case where interface circuitry 120 is operated at the low voltage level of 1V.

Figure 12:
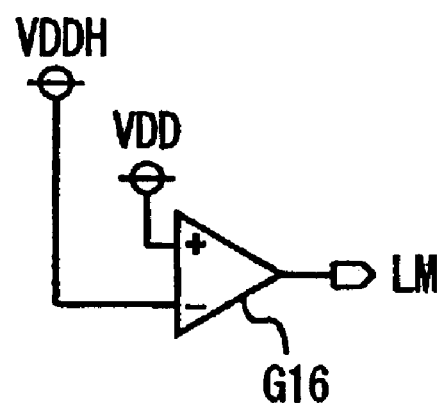
FIG. 12 is a circuit diagram of another structure of a mode select circuit included in the semiconductor device of the seventh embodiment.

FIG. 12 shows another circuit of a mode select circuit provided in the semiconductor device of the seventh embodiment.

Referring to FIG. 12, a mode select circuit 200A receives a power supply voltage VDD of core circuitry 110, instead of reference voltage VREF, based on a structure similar to that of mode select circuit 200.

In mode select circuit 200A, amplifier G16 compares power supply voltage VDDH of interface circuitry 120 with power supply voltage VDD of core circuitry 110 to output a mode select signal of an H level (VDD) when power supply voltage VDDH is lower than power supply voltage VDD. For example, when power supply voltage VDD of core circuitry 110 is 1.5V, and power supply voltage VDDH of interface circuitry 120 is 1V, mode select circuit 200A outputs a mode select signal of an H level.

The above-described mode select circuits 200 and 200A can be provided also in semiconductor devices 101–104 of the second to fifth embodiments, respectively. Mode select circuit 200 can also be provided in semiconductor device 105 of the sixth embodiment. In such a case, it is to be noted that two mode select circuits 200 generating a mode select signal LM1 and a mode select signal LM2 are to be provided in the structure based on the sixth embodiment since two mode select signals LM1 and LM2 are required. Appropriate reference voltages VREFs are to be applied to respective mode select circuits 200.

According to the semiconductor device of the seventh embodiment, power supply voltage VDDH of interface circuitry is compared with a reference voltage or the power supply voltage VDD of core circuitry so as to generate internally a mode select signal LM automatically. Thus, the wiring to receive a mode select signal LM from an external source becomes dispensable.

Eighth Embodiment

In contrast to semiconductor device 100 of the first embodiment that has mode select signal LM generated at an internal circuit in core circuitry 110, the semiconductor device of the eighth embodiment has mode select signal LM set by an external source via a terminal.

Figure 13:
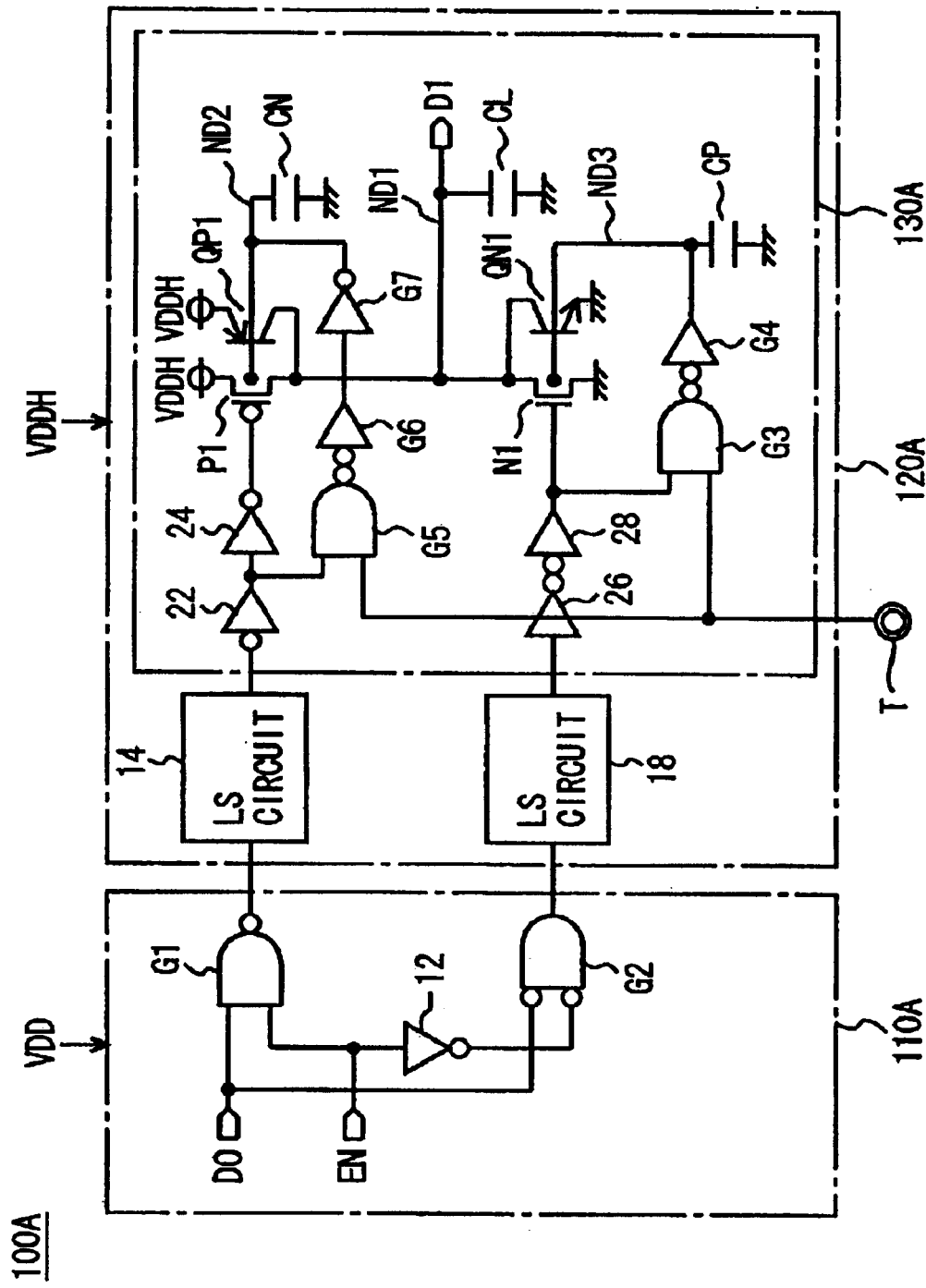
FIG. 13 is a circuit diagram to describe the portion related to data output of a semiconductor device according to an eighth embodiment.

Referring to FIG. 13, a semiconductor device 100A of the eighth embodiment includes core circuitry 110A and interface circuitry 120A.

Core circuitry 110A differs from core circuitry 110 of semiconductor device 100 of the first embodiment shown in FIG. 2 in that mode select signal LM is not output to interface circuitry 120A. The remaining structure of core circuitry 110A is similar to that of core circuitry 110, and description thereof will not be repeated.

Interface circuitry 120 is based on the structure of interface circuitry 120 of semiconductor device 100 according to the first embodiment shown in FIG. 2, provided that level shift circuit 16 is absent, and an output drive circuit 130A is substituted for output drive circuit 130.

Output drive circuit 130A is basically similar in structure to output drive circuit 130 of semiconductor device 100 of the first embodiment, provided that NAND gates G5 and G3 receive mode select signal LM which is set by a external source to semiconductor device 100A via an external terminal T, instead of receiving a mode select signal LM generated from the internal circuit in core circuitry 110A. The remaining circuit structure of output drive circuit 130A is similar to that of output drive circuit 130. Therefore, description thereof will not be repeated.

In semiconductor device 10A, a mode select signal LM of an L level (GND) and of an H level (VDH) is input through external terminal T when power supply voltage VDDH received by interface circuitry 120A is of the conventional voltage level (3V type) and of the low voltage level (1V type), respectively.

Accordingly, output drive circuit 130A functions likewise semiconductor device 130 of the first embodiment. In other words, output drive circuit 130A operates as in a conventional manner when power supply voltage VDDH is of the general voltage level (3V type), and has output node ND1 charged and discharged at high speed by PNP parasitic bipolar transistor QP1 and NPN parasitic bipolar transistor QN1 when power supply voltage VDDH is of the low voltage level (1V type). Therefore, output drive circuit 130A operates at high speed even in the case where power supply voltage VDDH of interface circuitry 120A is of a low voltage level.

The externally applied mode select signal LM through external terminal T may take an H level (VDDH) when power supply voltage VDDH received by interface circuitry 120A is of the conventional voltage level (3V type), and take an L level (GND) when power supply voltage VDDH received by interface circuitry 120A is of the low voltage level (1V type). In this case, an inverter is inserted between external terminal T and NAND gates G5, G3 to establish compliance with the logic.

According to semiconductor device 100A of the eighth embodiment, the parasitic bipolar transistor of the output transistor is driven according to the output data based on mode select signal LM input through external terminal T when power supply voltage VDDH of interface circuitry 120A is of the low voltage level. Therefore, the drivability of output node ND1 is compensated for by the parasitic bipolar transistor to allow interface circuitry 120A to operate without degradation in speed even in the case where power supply voltage VDDH is of the low voltage level, likewise semiconductor device 100 of the first embodiment.

Since semiconductor device 100A of this embodiment can accommodate the cases where the voltage of interface circuitry is of the conventional voltage level (3V type) and of a low voltage level, restriction in the voltage of the logic device that can be incorporated on the board is eliminated. Accordingly, the cost can be reduced.

Furthermore, since power supply voltage VDDH of interface circuitry 120A can be lowered even in semiconductor device 100A of the eighth embodiment, power consumption of interface circuitry 120A is reduced to ⅑ when power supply voltage VDDH is 1V, as compared to the case of the conventional voltage level of 3V.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   core circuitry including a first MOS transistor formed of a gate oxide film having a first film thickness, and receiving a first power supply voltage to operate; and
   interface circuitry including a second MOS transistor formed of a gate oxide film having a second film thickness thicker than said first film thickness, and receiving a second power supply voltage to operate; wherein
       said core circuitry provides an internal signal to said interface circuitry to define a logic level of an output signal and said interface circuitry includes:
           an output MOS transistor circuit including said second MOS transistor and connected to an output node to drive said output node according to said internal signal, and
           an activation circuit activating a parasitic bipolar transistor circuit associated with said output MOS transistor circuit according to an operation of said output MOS transistor circuit when a low voltage operation mode is selected by a mode select signal.

2. The semiconductor device according to claim 1, wherein
   said output MOS transistor circuit includes:
       a P channel MOS transistor driving said output node to a potential corresponding to a high level according to said internal signal, and
       an N channel MOS transistor driving said output node to a potential corresponding to a low level according to said internal signal, and
   said parasitic bipolar transistor circuit includes:
       a PNP parasitic bipolar transistor associated with said P channel MOS transistor, and
       an NPN parasitic bipolar transistor associated with said N channel MOS transistor.

3. The semiconductor device according to claim 2, wherein
   said PNP parasitic bipolar transistor is turned ON in response to charge being discharged from a substrate of said P channel MOS transistor according to said internal signal, and
   said NPN parasitic bipolar transistor is turned ON in response to charge being supplied to a substrate of said N channel MOS transistor according to said internal signal.

4. The semiconductor device according to claim 2, wherein said core circuitry further includes a charge and discharge drive circuit,
   said charge and discharge drive circuit drives said NPN parasitic bipolar transistor according to said internal signal when said low voltages operation mode is selected.

5. The semiconductor device according to claim 4, wherein said charge and discharge drive circuit drives said NPN parasitic bipolar transistor by charging and discharging charge with respect to the substrate of said N channel MOS transistor according to said internal signal.

6. The semiconductor device according to claim 2, wherein said core circuitry further includes another activation circuit activating said parasitic bipolar transistor circuit according to an operation of said output MOS transistor circuit when said low voltage operation mode is selected,
   said another activation circuit includes a charge drive circuit,
   said activation circuit includes a discharge drive circuit, and when said low voltage operation mode is selected,
   said charge drive circuit turns OFF said PNP parasitic bipolar transistor according to said internal signal,
   said discharge drive circuit turns ON said PNP parasitic bipolar transistor according to said internal signal.

7. The semiconductor device according to claim 6, wherein said charge drive circuit turns said PNP parasitic bipolar transistor OFF by supplying charge to a substrate of said P channel MOS transistor according to said internal signal, and
   said discharge drive circuit turns said PNP parasitic bipolar transistor ON by discharging charge from the substrate of said P channel MOS transistor according to said internal signal.

8. The semiconductor device according to claim 6, wherein said activation circuit further includes another charge drive circuit,
   said another charge drive circuit turns OFF said PNP parasitic bipolar transistor irrespective of the voltage level of said internal signal when said low voltage operation mode is not selected.

9. The semiconductor device according to claim 8, wherein said another charge drive circuit turns said PNP parasitic bipolar transistor OFF by supplying charge to a substrate of said P channel MOS transistor.

10. The semiconductor device according to claim 6, wherein said discharge drive circuit includes:
    another N channel MOS transistor, and
    another NPN parasitic bipolar transistor associated with said another N channel MOS transistor according to an operation of said another N channel MOS transistor.

11. The semiconductor device according to claim 10, wherein said another NPN parasitic bipolar transistor is configured by connecting a gate terminal of said another N channel MOS transistor to a substrate of said another N channel MOS transistor.

12. The semiconductor device according to claim 10, wherein said another activation circuit further includes a charge and discharge drive circuit,
    said charge and discharge drive circuit drives said another NPN parasitic bipolar transistor according to said internal signal when said low voltage operation mode is selected.

13. The semiconductor device according to claim 12, said charge and discharge drive circuit driving said another NPN parasitic bipolar transistor by charging and discharging charge with respect to the substrate of said another N channel MOS transistor according to said internal signal.

14. The semiconductor device according to claim 13, wherein said another N channel MOS transistor has its gate terminal connected to a ground node.

15. The semiconductor device according to claim 10, wherein said another activation circuit includes
    a first base drive circuit driving said NPN parasitic bipolar transistor according to said internal signal when said low voltage operation mode is selected, and
    a second base drive circuit driving said another NPN parasitic bipolar transistor according to said internal signal when said low voltage operation mode is selected, and
    said activation circuit includes
    a third base drive circuit driving said NPN parasitic bipolar transistor according to said internal signal when another low voltage operation mode for operating at a voltage level higher than the voltage level in said low voltage operation mode is selected by said mode select signal, and a fourth base drive circuit driving said another NPN parasitic bipolar transistor according to said internal signal when said another low voltage operation mode is selected.

16. The semiconductor device according to claim 15, wherein said first and third base drive circuits drive said NPN parasitic bipolar transistor by charging and discharging charge with respect to a substrate of said N channel MOS transistor according to said internal signal, and said second and fourth base drive circuits drive said another NPN parasitic bipolar transistor by charging and discharging charge with respect to a substrate of said another N channel MOS transistor according to said internal signal.

17. The semiconductor device according to claim 1, wherein the interface circuit comprises:

a level conversion circuit converting a potential amplitude of a signal received from said core circuitry into a potential amplitude corresponding to said second power supply voltage; and a switch circuit receiving a signal from said core circuitry and a signal having the potential amplitude converted by said level conversion circuit;

wherein said switch circuit provides said signal received from said core circuitry to said output MOS transistor circuit and said activation circuit when said low voltage operation mode is selected, and provides said signal having the potential amplitude converted by said level conversion circuit to said output MOS transistor circuit and said activation circuit when said low voltage operation mode is not selected.

18. The semiconductor device according to claim 1, wherein said core circuitry includes a mode select circuit generating and providing to said interface circuitry said mode select signal, and said mode select circuit receives said second power supply voltage to compare said second power supply voltage with a reference voltage and outputs said mode select signal when said second power supply voltage is lower than said reference voltage.

19. The semiconductor device according to claim 18, wherein said reference voltage is said first power supply voltage.

* * * * *

UNITED STATES PATENT AND TRADEMARK OFFICE
CERTIFICATE OF CORRECTION

PATENT NO. : 6,771,109 B2 Page 1 of 1
APPLICATION NO. : 10/315940
DATED : August 3, 2004
INVENTOR(S) : Yasunobu Nakase It is certified that error appears in the above-identified patent and that said Letters Patent is hereby corrected as shown below:

On the title page of the Letters Patent,

Under section "(73) Assignee:", change "OSAKA" to -- TOKYO --

Signed and Sealed this

First Day of August, 2006

JON W. DUDAS
*Director of the United States Patent and Trademark Office*